United States Patent
Kucukcakar et al.

[11] Patent Number: 5,907,698
[45] Date of Patent: May 25, 1999

[54] METHOD AND APPARATUS FOR CHARACTERIZING STATIC AND DYNAMIC OPERATION OF AN ARCHITECTURAL SYSTEM

[75] Inventors: Kayhan Kucukcakar, Cave Creek; Chih-Tung Chen; Jie Gong, both of Chandler; Thomas E. Tkacik, Phoenix, all of Ariz.

[73] Assignee: Motorola, Inc., Schaumburg, Ill.

[21] Appl. No.: 08/805,099

[22] Filed: Feb. 24, 1997

[51] Int. Cl.$^6$ ................................................. G06F 17/50
[52] U.S. Cl. ........................... 395/500.07; 395/500.02; 395/500.12
[58] Field of Search ............................. 364/488, 489, 364/490, 491, 578; 395/500

[56] References Cited

U.S. PATENT DOCUMENTS

| | | | |
|---|---|---|---|
| 5,111,413 | 5/1992 | Lazansky et al. | 364/578 |
| 5,461,577 | 10/1995 | Shaw et al. | 364/491 |
| 5,471,398 | 11/1995 | Stephens | 364/490 |
| 5,541,849 | 7/1996 | Rostoker et al. | 364/489 |
| 5,761,079 | 6/1998 | Drumm | 364/489 |

OTHER PUBLICATIONS

D. Knapp et al., "A Prescriptive Formal Model for Data–Path Hardware", IEEE Transactions on Computer–Aided Design, vol. 11, No. 2, Feb. 1992, pp. 158–183.

D. Knapp, "An Interactive Tool for Register–Level Structure Optimization", 26th ACM/IEEE Design Automation Conference, Paper 37.1, Aug. 1989, pp. 598–601.

Primary Examiner—Kevin J. Teska
Assistant Examiner—Matthew Loppnow
Attorney, Agent, or Firm—Robert D. Atkins

[57] ABSTRACT

A method (30) and apparatus (300) for characterizing the operation of an architectural system designed through a plurality of design tasks (102–112). The design tasks are associated with architectural design rules (114–124) that compare a mapping of the system to a set of rules which are indicative of an error-free system. Objects in the mapping that do not conform to the architectural rules are identified and can be displayed at multiple architectural levels through one or more editors (26–28) and modified without leaving the editors. The system is dynamically characterized by annotating an RTL component (step 153) and simulating the system over a range of simulation cycles. The annotated component (130) monitors states of the system for storing in an analysis database (24). States at selectable simulation cycles are displayed in different orders and at multiple architectural levels.

31 Claims, 13 Drawing Sheets

METHOD AND APPARATUS FOR CHARACTERIZING STATIC AND DYNAMIC OPERATION OF AN ARCHITECTURAL SYSTEM

CROSS REFERENCE TO RELATED PATENT APPLICATIONS

The present application is related to copending U.S. patent application 08/758,331, entitled "Method for Designing an Architectural System", filed Nov. 26, 1996, by Kucukcakar, et al., and assigned to the same assignee, Motorola Inc. The present application is further related to issued U.S. Pat. No. 5,533,179, entitled "Apparatus and Method of Modifying Hardware Description Language Statements," by Kucukcakar, et al., and assigned to the same assignee, Motorola Inc.; and issued U.S. Pat. No. 5,600,567, entitled "Method of Graphically displaying and Manipulating Clock-Based Scheduling of HDL Statements", by Kucukcakar, et al., and assigned to the same assignee, Motorola Inc.

BACKGROUND OF THE INVENTION

The present invention relates to integrated circuit design methods and, in particular, to a method for identifying errors and characterizing integrated circuit designs at an architectural level.

The complexity of modern integrated circuits has led to the development of architecture-based designs which use high level design methods to decrease design cycle time. For example, a typical high-level design method uses an algorithmic description of the behavior of an integrated circuit to generate a register transfer level (RTL) hardware implementation of the circuit. The RTL implementation is produced by executing a plurality of design tasks such as scheduling, resource allocation, binding (mapping behavioral statements to specific hardware components), and control unit generation.

The design tasks work interdependently to produce a design database that represents the integrated circuit at multiple architectural levels. In such a design method, design errors can be introduced during the design both by the designer and by the automated design tasks. The more complex the design the more difficult it is to correlate behavioral statements with RTL components in order to modify the design database to correct design errors. For example, if a scheduling error is introduced into the design, either a behavioral statement, an RTL component or system timing may need modification. Identifying the appropriate statement, component or timing signal to modify is often a time consuming, trial-and-error process.

To characterize the system's dynamic functionality, the system is simulated to verify that the operation is consistent with constraints which are not modeled with behavioral statements, such as propagation delay or component counts. Simulation is performed on the RTL implementation and produces data at the RTL or hardware architectural level.

Prior art error identification methods use a set of predefined error-checking rules to test design data only after the design is complete. Such methods are inefficient because the entire database is tested each time the method is executed. Because of the interdependency of the design tasks, if an error is introduced at an early stage in the design, the error often propagates into the data produced by subsequent design tasks. Multiple errors that must be identified and corrected are thereby generated from the original error. The result is an inefficient use of design and computing resources.

When the RTL implementation is simulated, data is produced that represents the system at a hardware level, whereas designers often are most familiar with the behavioral description of the system. As a result, design efficiency is further reduced to allow the designer to become more familiar with the RTL implementation.

Hence, there is a need for a more efficient method of analyzing the static and dynamic operation of a system that allows a designer to analyze the system at the earliest stages of a design and at the most appropriate architectural levels.

DETAILED DESCRIPTION OF THE DRAWINGS

Figure 1:
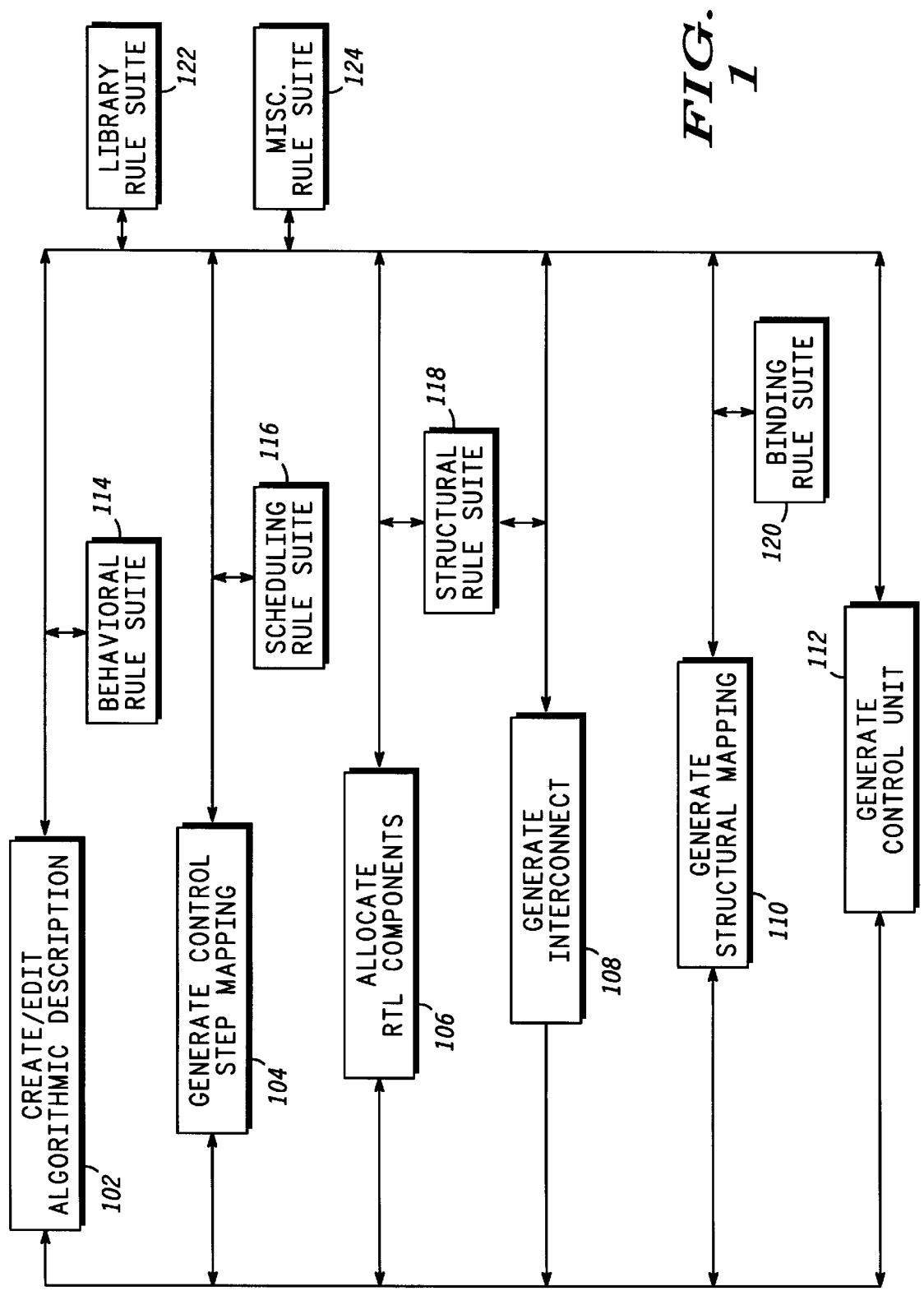
FIG. 1 is a flow diagram of an architectural design method.

FIG. 1 shows a design flow diagram of a micro-architectural design method comprising a series of design tasks designated as steps 102 through 112. The micro-architectural design method further includes a plurality of architectural rule suites 114–124 which are designed to verify data produced by design tasks 102–112. Some of the architectural rule suites are associated with particular design tasks as will be more fully described below. Each design task produces data that is stored in a design database (not shown).

The micro-architectural design method generates a register transfer level (RTL) hardware implementation of an integrated circuit from a behavioral or algorithmic description provided by a designer. The designer typically initiates the process after partitioning the integrated circuit design into hierarchical design blocks based on a design specification and the behavioral complexity of particular blocks. For example, a digital signal processing (DSP) core that interfaces with a bus can be further partitioned into bus interface block and a DSP core block.

At step 102, an algorithmic description is created or edited for each design block. The algorithmic description typically includes algorithmic data comprising behavioral statements entered interactively by a designer. The behavioral statements are arranged as a set of procedural statements written in a text-based programming language such as Hardware Description Language (HDL) or C language. Behavioral data also can be provided graphically by entering the operations in nodes of a flow diagram. An associated behavioral rule suite 114 is used for characterizing data produced at step 102.

At step 104, the order of execution of behavioral statements is scheduled by a control step mapping procedure. Control step mapping is defined as a process of mapping behavioral statements to specific clock cycles during which the behavioral statements are performed. Control steps describe the cycle-based timing for performing the functions or operations defined by the behavioral statements. Control step mapping data can be generated automatically using a utility program or produced interactively by the designer through an editor. An associated scheduling rule suite 116 is used for characterizing data produced at step 104.

At step 106, RTL components are allocated in accordance with the design specification, which often imposes limits on the number of particular RTL components to be used in a design. For example, power constraints or die area can limit the number of multiplier blocks that can be used if the multiplier consumes a large amount of power or die area. If there are no such limitations on the quantity of a particular RTL component, the quantity is determined according to the result of control step mapping (step 104). Component allocation data can be generated automatically using a utility program or produced interactively by the designer through an editor. An associated structural rule suite 118 is used for characterizing data produced at step 106.

The conductors that transfer signals among the RTL components are generated at interconnection step 108. In addition, switching devices such as multiplexers and tri-state drivers, which are needed for implementing RTL component sharing and communication protocol, are produced at step 108. The conductors and switching devices are generated according to the design specification while taking into account constraints introduced by the control step mapping and behavioral to structural mapping steps 104 and 110. Interconnect data can be generated automatically using a utility program or produced interactively by the designer through an editor. Data produced at interconnection step 108 is characterized using structural rule suite 118.

Structural mapping (step 110) determines which RTL component is associated with a particular variable or operation in the algorithmic description of a block. Structural mapping is also designated as binding because of the bindings or links which are formed between RTL components and behavioral statements. Binding data can be generated automatically using a utility program or produced interactively by the designer through an editor. An associated binding rule suite 120 is used for characterizing data produced at step 110.

Once the RTL components have been mapped to behavioral statements, a software utility produces a control unit (step 112) to implement the specified behavior, timing and resource allocation of the design. The control unit typically comprises a state machine that asserts a control signal to an RTL component at a specified time for implementing the specified behavior and timing. Control unit generation (step 112) is typically automatic and is performed as the last step in the design process.

It can be seen that the designer can branch from design task to design task in the most appropriate order to create the design. Data produced by each design task can be verified immediately by executing a utility program in the associated architectural rule suite. Alternatively, verification can be deferred until two or more design tasks, or even the entire design, have been completed. Hence, the designer can branch among the utility programs in the rule suites to execute the utility programs in different orders.

Each of the design tasks 102–112 generates data that represents the design at one or more architectural levels. For example, at step 102 behavioral data is generated and at step 104, data representing the control step mapping or scheduling of behavioral statements is generated. The design tasks generate portions of the design database, which is organized as a mapping of the algorithmic description to the RTL implementation. The design tasks are configured to maintain links among objects in the design database that represent similar design elements but at different architectural levels.

Figure 2:
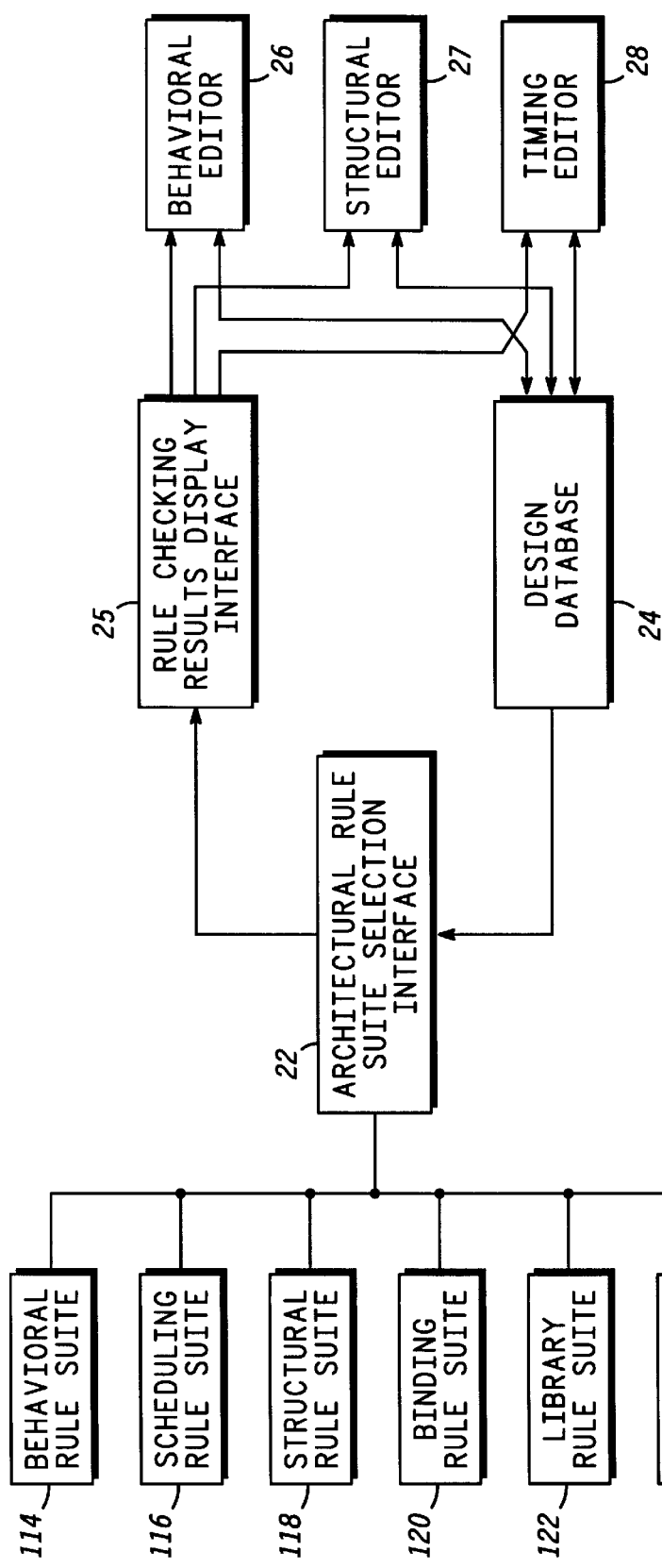
FIG. 2 is a block diagram of a system for identifying errors in the architectural design.

FIG. 2 shows a block diagram of a static error identification system 20 comprising an architectural rule suite selection interface 22, a design database 24, a result display interface 25 and a plurality of editors/viewers, including a behavioral editor 26, a structural editor 27, and a timing editor 28. Editors 26–28 allow the designer to view and edit the design database in which design data produced in steps 102–112 is stored. Static error identification system 20 further includes architectural rule suites 114–124, each of which includes a set of architectural rules and an executable utility program for comparing the set of architectural rules to the portion of design database 24 that is produced by the associated design task.

Design database 24 includes elements such as behavioral operations, variables and RTL components as well as mapping data. Mapping data includes links between different representations of design objects at multiple architectural levels.

Architectural rule suite selection interface 22 operates as a user interface in which the designer selects one or more of the architectural rule suites 114–124 from a menu. The architectural rules are arranged into individual suites to allow the designer to identify design errors at an architectural level at any point in the design process. In particular, the designer can test the mapping data produced by any of the design steps 102–112 by selecting a rule suite whose rules pertain to that design step. Errors are thereby identified and corrected at the earliest stages of a design, which reduces the amount of computing resources expended in propagating a design error generated at one architectural level through other architectural levels. In addition, a smaller amount of data is tested, which minimizes or eliminates redundant rule checking and reduces design cycle time. Alternatively, the designer can complete the design by performing all of the design tasks 102–112 and then selecting some or all of the rule suites for testing the design data. It can be seen that the designer is able to branch among the rule checking utilities to execute the utilities in different orders.

The mapping data in design database 24 includes objects whose parameters are tested for conformity with architectural rules in the selected rule suite. The architectural rules can characterize the object at a single or at multiple architectural levels. The architectural rules typically are specified to establish acceptance criteria with which the mapping parameters are expected to conform. For example, a multiplication operation in an algorithmic statement can be characterized by a scheduling parameter whose value represents the clock cycle during which the multiplication product is produced. A pertinent architectural rule can specify that the clock cycle occur after the multiplicands have been computed and are available. When the multiplication product is scheduled to be produced before the multiplicands are computed such that the clock cycle does not conform to the rule, an error flag or the like is set.

A mapping parameter can characterize not only a design object but also a relationship between objects in design database 24. For example, if a parameter characterizes the relationship between a variable in a behavioral statement and the clock cycle during which the variable is produced, the variable is represented at the algorithmic architectural level as a variable and at the scheduling architectural level as a clock cycle. If the value of the variable is computed by an RTL component in the RTL implementation, the variable is also represented at the hardware architectural level as the RTL component.

As design tasks evolve or specific parameters are no longer useful, architectural rules can readily be deleted or modified, or new architectural rules added. Rules can pertain to specific steps in the micro-architectural design method, can be global in nature, or can be specific to a design in order to assist the designer in focusing on critical aspects of a design.

Behavioral rule suite 114 typically includes architectural rules relating to the creation or editing of behavioral statements, such as syntax-checking rules and rules for ensuring consistency among objects mapped at different architectural levels. An example of a consistency rule is one that tests whether a behavioral statement has declared an input to be an output.

Scheduling rule suite 116 typically includes architectural rules that characterize parameters of scheduled objects such as operations and variables. Scheduling parameters are included in the control step mapping data produced at step 104, and typically describe the scheduling or ordering of operations specified in the behavioral statements. For example, execution order is a parameter that characterizes a relationship between behavioral statements. An associated ordering rule specifies a required or desired execution order between operations in one or more behavioral statements in the algorithmic description. For example, an ordering rule can specify that a first operation be executed after a second operation when the first operation requires a value that is computed by the second operation.

Structural rule suite 118 includes architectural rules relating to RTL component data produced at step 106, interconnect data produced at step 108 and control unit data produced at step 112. Rules relating to resource (i.e., RTL component) allocation are typically included in a structural rule suite. For example, an RTL component has an associated resource allocation parameter that indicates the number of times the RTL component has been instantiated in the RTL implementation. An associated resource allocation rule can specify a limit on the number of instances of the RTL component, such as where the RTL component consumes a large amount of power or die area.

Structural rule suite 118 includes rules for determining the propagation delay of a signal through an interconnect path. Propagation delay rules are used to identify long delay paths in the RTL implementation. The propagation delay is computed from the delay properties of the RTL components and conductors in the interconnect path, and can be expressed in time units (i.e., nanoseconds) or integral gate delays. Propagation delay rules test interconnect paths for such characteristics as a minimum or maximum delay.

Binding suite 120 typically includes architectural rules relating to structural mapping parameters that characterize the relationship between behavioral statements produced at step 102 and RTL components produced at step 110. For example, a concurrent usage parameter of an RTL component indicates the number of operations mapped to the RTL component that are scheduled at step 104 for execution during a specified clock cycle. An associated concurrent resource usage rule specifies a minimum or maximum limit on the number of such operations such that an error flag is set when the value of the parameter does not conform to the limit specified in the rule. More particularly, an RTL pipelined multiplier component may have the capability of performing at most two separate multiply operations in a specified clock cycle. An error flag is set when three multiply operations are scheduled in the RTL pipelined multiplier component during the clock cycle.

Operation mapping rules are included in binding rule suite 120 to specify acceptance criteria of operation mappings. An operation mapping parameter characterizes a relationship between an operation in a behavioral statement and the RTL component that is scheduled to execute the operation. Operation mapping rules are used to determine if an RTL component is capable of performing the operation. For example, where an addition operation is mapped to a particular adder component for execution, one associated operation mapping rule tests whether the input/output bit-widths of the operands of the addition operation match the corresponding bitwidths of the input/output ports of the adder component. The rule can be used to detect whether say an eight-bit addition has been mapped to a four-bit adder component.

Storage rules are included in binding rule suite 120 to test storage properties of mappings among behavioral statements and RTL storage components such as registers. Storage rules are used to characterize whether, when, and how to store data values computed by operations of behavioral statements. For example, where such a data value is produced by an operation in a behavioral statement during one clock cycle and mapped to a register storage component, a first storage parameter indicates whether the data value is to be used by another operation at a later clock cycle. An associated first storage rule, designated as a value lifetime rule, specifies that the data value be retained in the register storage component until it has been used by the other operation.

A second storage parameter indicates whether a data value produced by one RTL component is to be used by another RTL component at a later clock cycle. An associated second storage rule specifies that the data value be retained in a register storage component until the data value has been used by the other RTL component.

A third storage parameter represents the bitwidth of a data value. An associated third storage rule is used to identify a register storage component that has an appropriate bitwidth for receiving the data value. For example, if the bitwidth of the data value is eight bits, the third storage rule is used to ensure that the bitwidth of the input port of the register storage component is also eight bits.

Binding rule suite 120 further includes architectural rules relating to data transfers. A data transfer parameter characterizes a relationship between a data value produced by a first RTL component, used by a second RTL component, and transferred on a specified interconnect path. Data transfer rules are used to determine whether, when, and how to transfer data values between RTL components. A first data transfer rule is used to determine whether a data value produced by a first RTL component is used by a second RTL component in order to ensure that the data value is scheduled to be transferred between the first and second RTL components.

Where a data value produced by a first RTL component is used by a second RTL component, a second data transfer rule is used to determine whether the second RTL component is available to receive the data value on a specified clock cycle. The second RTL component is not available if already scheduled to receive another data value.

A third data transfer rule is used to identify an interconnect path that is available for transferring a data value produced by a first RTL component and used by a second RTL component. Each leg of interconnect path has a parameter that indicates whether the interconnect path is being used to effect a data transfer. If such a data transfer has previously been scheduled such that the interconnect path is not available, an error flag is set when a second data transfer is scheduled on the interconnect path at the same time as the previously scheduled transfer.

Some architectural rule suites are not associated with specific design tasks. For example, a library suite comprises a collection of rules used for creating accurate RTL library components. In particular, if a register library device were created without a clocking input, a rule in the library suite could be used to identify the omission. The library designer would be instructed to include a clocking input in the device definition.

A miscellaneous suite includes architectural rules that are global in nature or do not readily fit into one of the above-described architectural design task-based suites. Rules which are tool-dependent or code-dependent are often placed in a miscellaneous suite. For example, if software code limits the identifying name of any object in design database 24 to 256 characters, a design rule relating to the limitation is typically included in the miscellaneous suite.

Each of the rule suites 114–124 includes an executable utility program. The utility in a selected rule suite is executed to compare the portion of the mapping data that was generated by an associated design task with the architectural rules in the selected rule suite. Each such utility thereby tests mapping data for compliance with the associated architectural rules. The utility transmits the results of the comparison to result display interface 25 for viewing through editors 26–28.

Design database 24 typically includes several types of data in different formats. Data in such diverse formats is best viewed and edited using specialized editors which are optimized for displaying a particular format. For example, the behavioral description includes behavioral statements typically written in a textual format. The behavioral statements are therefore best viewed in behavioral editor 26, which is optimized for text viewing and editing.

RTL component and interconnect data are most understandable when displayed as schematic diagrams. For that reason, such data is viewed in structural editor 27, which is optimized for displaying and editing schematic diagrams.

Control step mapping or scheduling data is best understood when displayed as timing diagrams. Scheduling data is therefore viewed using timing editor 28, which is optimized for displaying and editing timing diagrams. It should be apparent that other optimized editors/viewers can be used to enhance the display of data in a format different from those described above.

Figure 3:
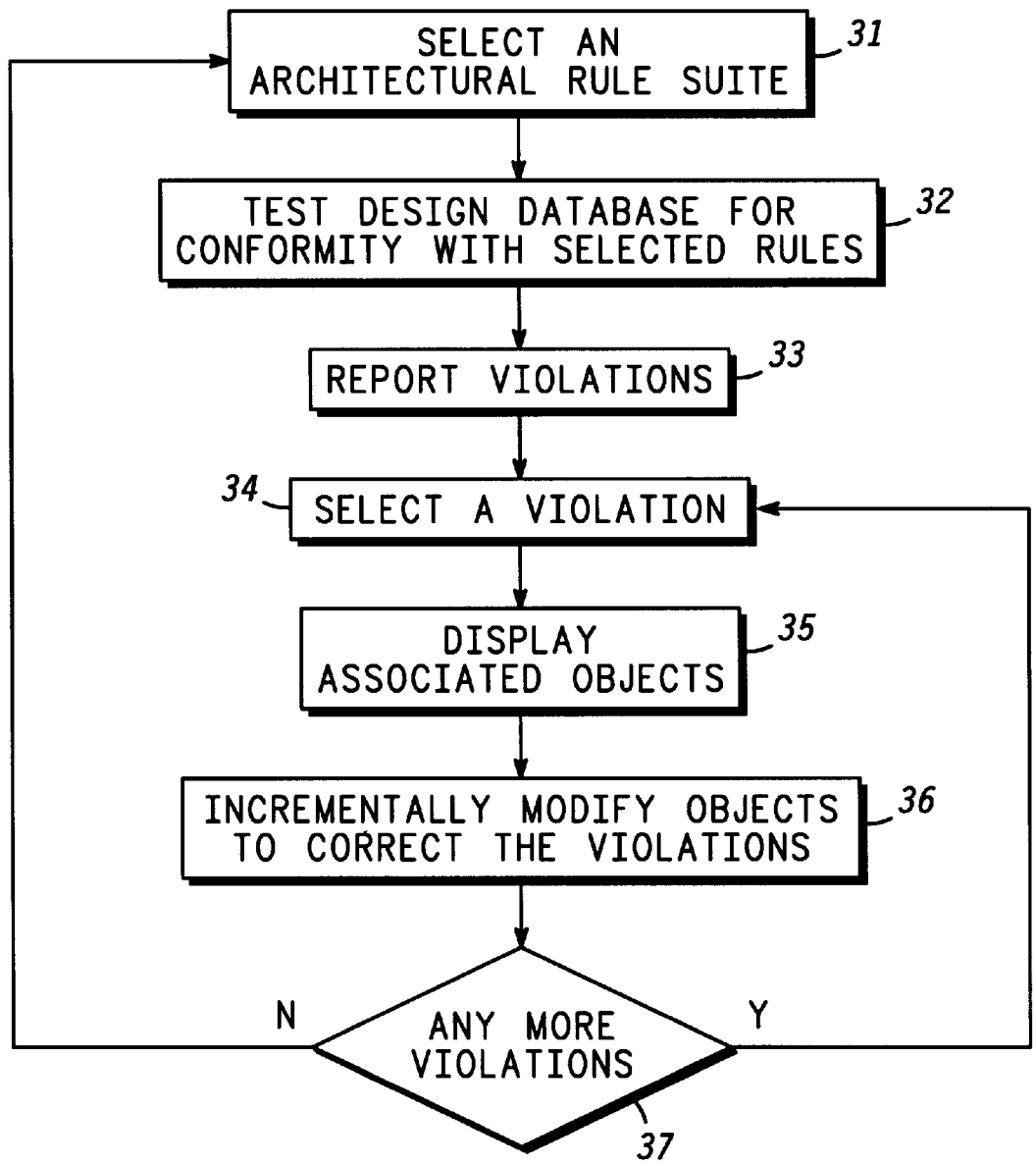
FIG. 3 is a flow chart of the method for identifying errors in the architectural design.

FIG. 3 is a flow chart of a static error identification method 30 comprising steps 31–37. Static error identification method 30 is configured such that all or any portion of the mapping data in design database 24 can be tested for compliance with a user-selectable set of architectural rules as described above. The method provides a high degree of flexibility and efficient use of computing resources because design data can be tested after the completion of an architectural design or at an intermediate point in the design process after any of the steps 102–112.

At step 31, an architectural rule suite is selected interactively by the designer through interface 22. An architectural rule suite includes a set of architectural rules which characterize a successful mapping of the behavioral description to a RTL implementation, i.e., a mapping in which the RTL implementation executes all of the operations and functions of the algorithmic description. Such a mapping includes objects which represent design elements at different architectural levels and links between objects. For example, suppose a RTL implementation includes a multiplier which is scheduled to execute a multiply operation of a behavioral statement during a specific clock cycle. The multiplier, behavioral statement and clock cycle are objects of the mapping which represent the same aspect of the design but at different architectural levels. The multiplier is an object at a structural level, the behavioral statement is an object at a behavioral or algorithmic level and the clock cycle is an object at the scheduling level. The multiplier is characterized by a concurrent resource usage parameter as described above, which characterizes the multiplier, the behavioral statement and the clock cycle. The above example shows how a mapping parameter can be associated with multiple mapping objects at multiple architectural levels.

At step 32, a utility program associated with the selected architectural rule suite is executed to compare each rule in the selected suite with associated mapping parameters in order to determine whether the properties conform to the rule. When a parameter violates an architectural rule, i.e., does not conform to the rule, the violation is reported in results display interface 25 (step 33). Mapping objects associated with the violation are also transmitted to results display interface 25.

At step 34, the designer interactively selects a rule violation displayed through result display interface 25. Objects associated with the violation are viewed through one or more of the editors 26–28 (step 35), depending on the architectural level at which the object is represented. Where the object violates a rule that spans multiple architectural levels, the objects can be displayed concurrently through the appropriate editors and highlighted in context. For example, assume two behavioral statements are scheduled to be executed by the same RTL component on the same clock cycle, thereby violating a concurrent resource usage rule. At the algorithmic architectural level, the designer can view the algorithmic description through behavioral editor 26 with the two behavioral statements highlighted. At the scheduling architectural level, the designer can use timing editor 28 to view a timing diagram with the clock cycle highlighted. At the hardware architectural level, the designer can use structural editor 27 to view the RTL implementation with the RTL component highlighted. Such highlighting in context often facilitates identifying the source of the violation.

At step 36, the highlighted objects associated with the violation can be incrementally evaluated to determine whether the violation indicates a design error. If so, the designer can make desired corrections. As a feature of the present invention, the editor through which an object is viewed is linked to design database 24 such that an object can be modified to correct the design error as the object is being viewed in the editor. The violation is then deleted from result display interface 25.

At step 37, the designer determines whether any violations remain to be examined and, if so, loops back to step 34 to select the next violation. When all the violations have been examined, either the error identification process terminates or the designer loops back to step 31 to select another rule suite.

An understanding of the features and advantages of the present invention is best obtained by an example involving a mapping produced by executing steps 102–112 of FIG. 1. In particular, assume a RTL implementation of an integrated circuit is produced which computes a difference of squares function of two values applied at inputs INP1 and INP2, respectively. An algorithmic description of the desired function is created (step 102) which comprises behavioral statements 1 through 5 shown in Table 1 below.

Table 1.

1. X=INP1
2. Y=INP2
3. X1=X*X
4. Y1=Y*Y
5. OUT=X1-Y1

Once the algorithmic description is entered into the design database, the RTL implementation can be generated automatically by performing steps 104–112 in accordance with design constraints imposed on the design tasks. Alternatively, the designer can interactively customize particular aspects of the algorithmic description and RTL implementation.

For example, suppose the designer interactively constrains the RTL implementation to provide an output every fourth clock cycle and to use a single two-cycle pipelined multiplier circuit. Control step mapping is interactively modified through timing editor 28 at step 104 and the two-cycle pipelined multiplier circuit is allocated through structural editor 27 at step 106.

Figure 4:
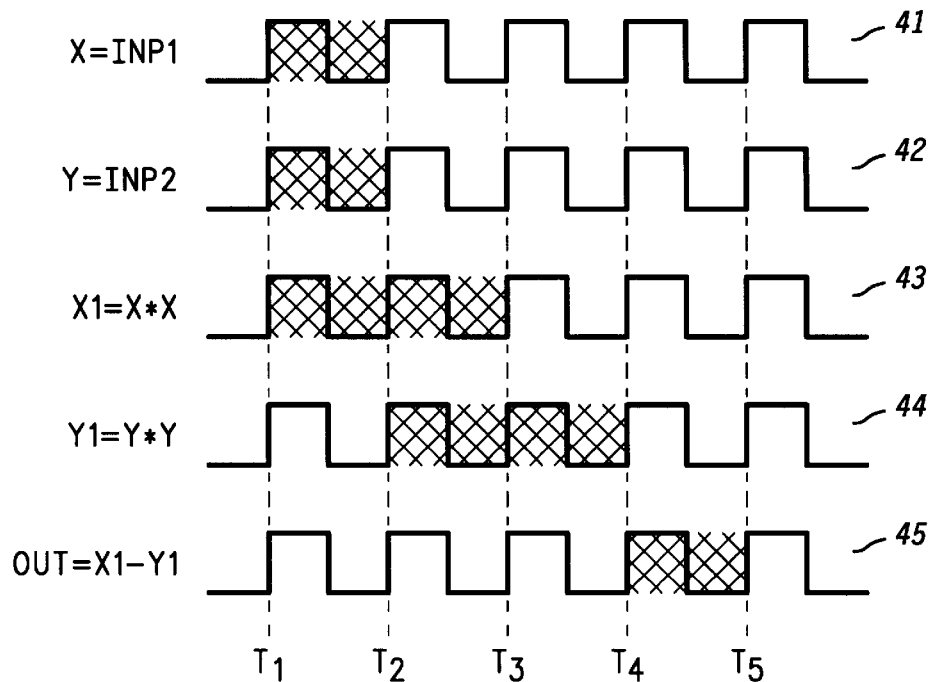
FIG. 4 is a timing diagram of a control step mapping associated with an algorithmic description.

FIG. 4 is a timing diagram 40 showing the control step mapping for the algorithmic statements of Table 1 in relation to cycles of a system clock and constrained to provide an output every fourth clock cycle and to use a single two-cycle pipelined multiplier circuit as described above. For clarity, the clock cycles during which each statement is executed are shaded. Waveforms 41 and 42 show input values X and Y being received at inputs INP1 and INP2, respectively, during cycle $T_1$.

Waveform 43 indicates that the multiplication X1=X*X is performed during cycles $T_1$ and $T_2$, and waveform 44 indicates that the multiplication Y1=Y*Y is performed during cycles $T_2$ and $T_3$. Because a two-cycle pipelined multiplier is used, both of the multiplication operations defined in statements 3 and 4 of Table 1 can be performed with the same pipelined multiplier. Accordingly, waveforms 42 and 43 overlap during cycle $T_2$. Waveform 45 shows output value OUT=X1-Y1 being generated during cycle $T_4$ because of the fourth-cycle constraint imposed by the designer.

After the control step mapping is concluded, step 106 is performed by specifying particular RTL components, such as the single two-cycle pipelined multiplier, using structural editor 28. A required subtractor circuit and two registers for storing intermediate values Y, X1 and Y1 are also allocated.

Assuming the pipelined multiplier, the subtractor and the two registers are allocated, the structural mapping (step 110) is often performed before the interconnect is generated (step 108) to link specific RTL components allocated at step 106 to particular algorithmic operations. For example, the pipelined multiplier allocated at step 106 is mapped to the multiplication operations of behavioral statements 3 and 4 of Table 1. Similarly, the subtraction operation of behavioral statement 5 of Table 1 can be linked to the subtractor circuit allocated at step 106, and intermediate values Y, X1 and Y1 can be mapped to particular registers allocated at step 106.

After the behavioral description, the control step mapping, the RTL component allocation, and the structural mapping are satisfactorily completed, the interconnection and the control unit are generated (steps 108, 112) to complete the RTL implementation.

Figure 5:
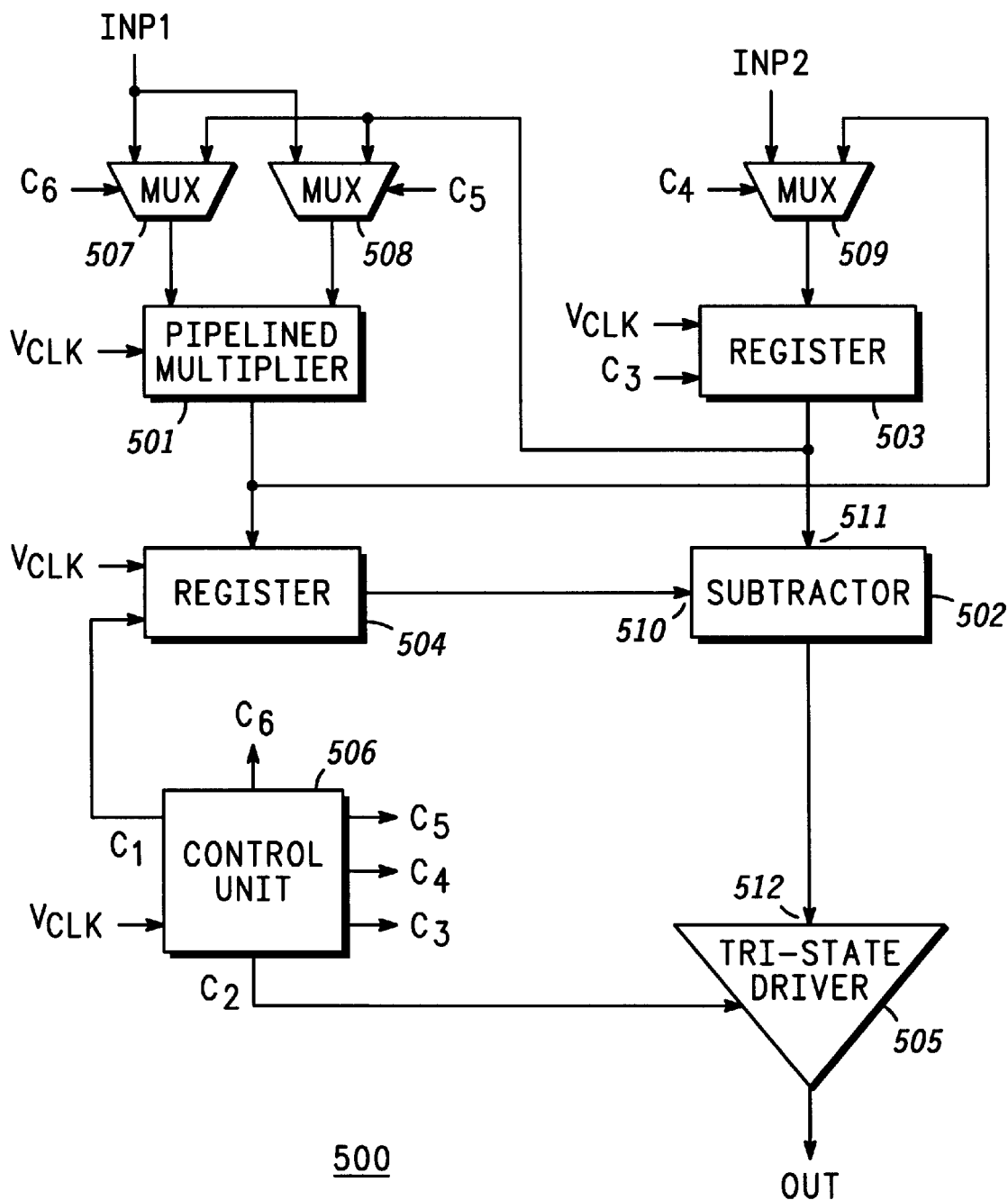
FIG. 5 is a schematic diagram of an RTL hardware implementation of the algorithmic description.

FIG. 5 is a schematic diagram showing an exemplar RTL implementation 500 of behavioral statements 1 through 5 of Table 1, as constrained by the timing shown in timing diagram 40, in an integrated circuit embodiment. It is assumed that RTL implementation 500 represents a successful mapping to the behavioral statements of Table 1 in the sense that RTL implementation 500 is capable of executing the algorithm defined by the statements of Table 1. RTL implementation 500 includes a pipelined multiplier 501, a subtractor 502, registers 503 and 504, a tri-state driver 505, a control unit 506 and multiplexers 507, 508 and 509. An input INP1 receives a value X and an input INP2 receives a value Y. An output provides a computed result OUT=X2-Y2 in accordance with the algorithm defined by behavioral statements 1 through 5 of Table 1. A system clock $V_{CLK}$ provides cycle timing.

RTL components are allocated in accordance with the above described steps. In particular, pipelined multiplier 501 is allocated interactively at step 106 to perform the multiplication operations of behavioral statements 3 and 4 of Table 1. Similarly, subtractor 502 is allocated interactively at step 106 to perform the subtraction operation of statement 5 of Table 1. Registers 503 and 504 are allocated at step 106 to store intermediate values Y, X1 and Y1 of Table 1. Interconnection conductors and multiplexers 507–509 are generated automatically at step 108.

Control unit 506 is generated automatically at step 112 to provide control signals $C_1$–$C_6$ to particular components for implementing the specified algorithmic description and timing. For example, tri-state driver 505 has a control input which receives control signal $C_2$ during cycle $T_4$ from control unit 506 to provide the computed result OUT to the output or to set tri-state driver 505 in a tri-state mode.

Figure 6:
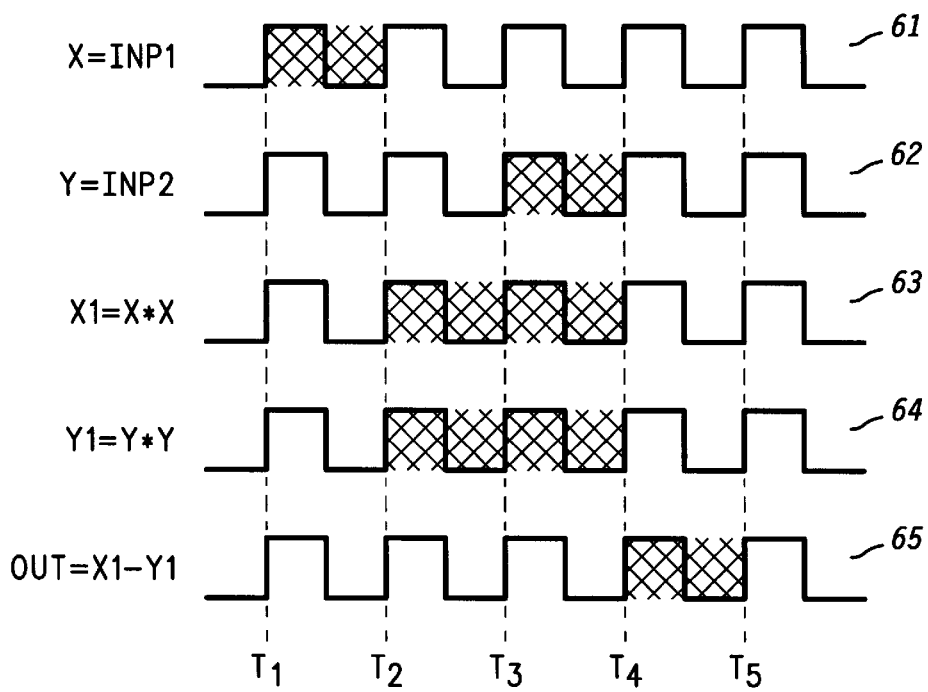
FIG. 6 is a timing diagram of a modified control step mapping associated with the algorithmic description.

FIG. 6 shows a timing diagram 60 representing another control step mapping of RTL implementation 500, including waveforms 61–65. Waveforms 61, 64 and 65 correspond to waveforms 41, 44 and 45 of FIG. 4. The clock cycles during which each statement is executed are shaded. Note that the scheduling of behavioral statements 2 and 3 of Table 1 as shown in waveforms 62 and 63 are different from the scheduling shown in FIG. 4 in waveforms 42 and 43. In particular, waveform 62 shows input value Y being received at input INP2 (statement 2) during cycle $T_3$. Waveform 63 shows the multiplication Y1=Y*Y (statement 4) being scheduled during cycles $T_2$ and $T_3$. The scheduling shown in timing diagram 60 cannot be successfully executed because the multiplication operation of statement 3 is scheduled (cycles $T_2$ and $T_3$) before multiplicand Y has been received (cycle $T_3$). Such inconsistent scheduling often occurs when scheduling modifications are made by a designer interactively through timing editor 28. However, inconsistencies can also arise when data is generated automatically, due to constraints introduced in the algorithmic description at step 102.

The inconsistent scheduling of behavioral statements 2 and 4 is detectable by the designer once the control step mapping of step 104 is completed. Other design steps need not be performed before errors can be identified and corrected in the control step mapping data. The designer selects scheduling rule suite 116 through interface 22 and runs the associated rule-checking utility that tests the pertinent portions of design database 24 and advises the designer of the potential inconsistency. The designer views associated objects through results display interface 25 as described below.

Figure 7:
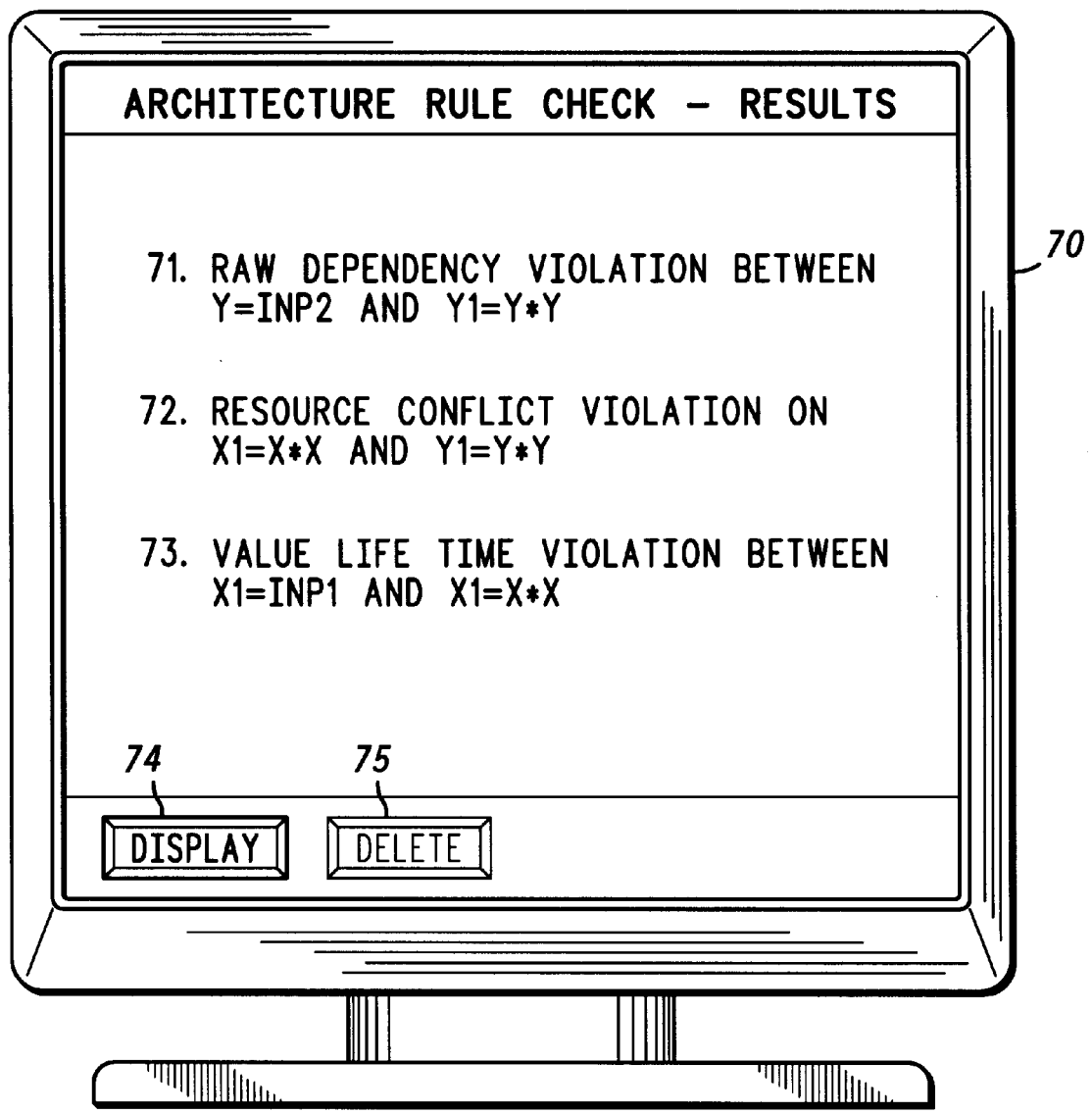
FIG. 7 is a display view of reported results of the static troubleshooting method.

FIG. 7 shows a display view 70 of results reported by static error identification method 30 after scheduling, binding and structural rule suites have been selected and the associated mapping properties tested against the selected architectural rules (steps 31–33). Display view 70 includes statements or violations 71–73, which respectively communicate violations of particular architectural rules in the selected rule suite, and editing controls 74 and 75.

Statement 71 indicates that a read-after-write (RAW) dependency architectural rule was violated. The RAW dependency rule tests an ordering parameter of a behavioral statement. More particularly, the relationship between statement 2 (Y=INP2) and statement 4 (Y1=Y*Y) of Table 1 is characterized by an ordering parameter whose value represents the relative order in which statements 2 and 4 are executed. The associated RAW dependency architectural rule specifies that statement 2 be executed before statement 4 because a value needed for executing statement 4, i.e., Y, is not available until it has been received or computed during the execution of statement 2. The rule was violated because statement 4 was scheduled to be executed during clock cycles $T_2$ and $T_3$, whereas statement 2 was scheduled to be executed later, during clock cycle $T_3$, as shown in waveforms 62 and 64 of FIG. 6. Accordingly, statement 71 communicates to the designer that a RAW dependency architectural rule was violated with respect to statements 2 and 4 of Table 1.

Editing controls 74 and 75 are graphically displayed buttons which typically are activated using a mouse or other pointing device. Editing controls 74 and 75 assist the designer in evaluating and correcting rule violations displayed through results display interface 25. Specific objects associated with selected rule violations 71–73 can be displayed and edited interactively through editors 26–28 by selecting editing control 74. When the designer has examined a violation and made desired corrections, the violation is deleted by selecting editing control 75.

Figure 8:
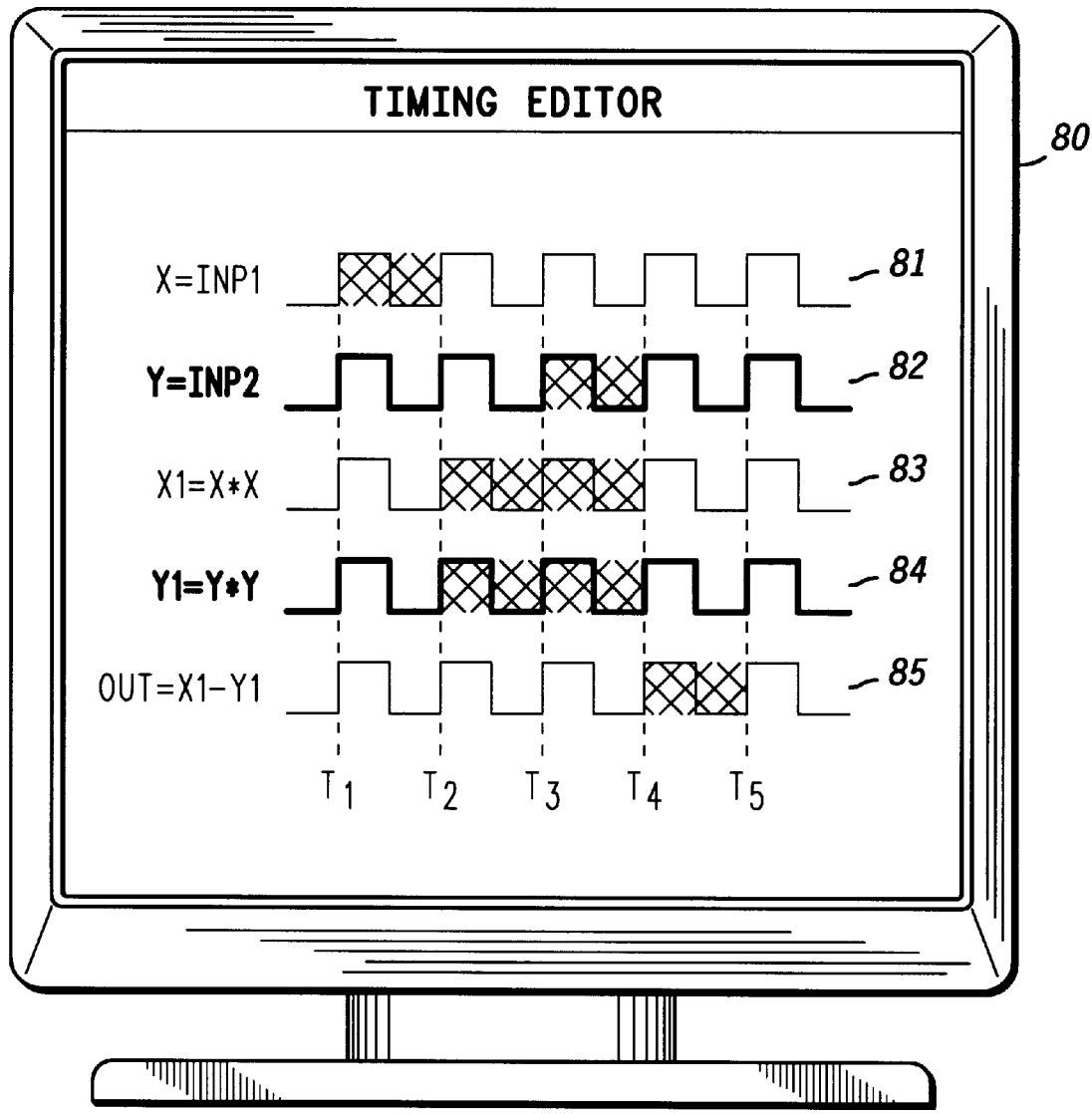
FIG. 8 is a display view of a timing chart.

FIG. 8 shows an example of a display view 80 for displaying objects associated with violation 71 in timing editor 28 (steps 34 and 35) through result display interface 25. Display view 80 includes display elements 81–85, corresponding to behavioral statements 1–5 of Table 1 and waveforms 61–65 of FIG. 6, respectively. Timing editor 28 provides an editing environment for the cycle-based timing of the behavioral statements described in Table 1.

Timing waveforms 62 and 64 and behavioral statements 2 and 4 are objects associated with violation 71 and represented in timing editor 28 through display elements 82 and 84, respectively. Display elements 82 and 84 are highlighted by results display interface 25 for easier identification and for allowing displayed objects to be viewed in context, so the designer can understand the violation and make corrections more easily. Highlighting of a displayed object typically is accomplished by increasing the brightness of the object, but can also include line coding, color coding, blinking and the like.

Recall that violation 71 indicates a violation of a RAW dependency architectural rule pertaining to the order in which statements 2 and 4 were scheduled during control step mapping (step 104). By highlighting display elements 82 and 84 which are associated with violation 71, a potential mapping problem is detected at an early stage in the design before completing other design tasks. Note that highlighted display elements 82 and 84 are viewed in context along with other waveforms of the system using timing editor 28. An advantage of such viewing in context through an appropriate editor is that data in design database 24 is immediately accessible and that the designer can correct the violation as it is being viewed without leaving the editor. For example, violation 71 can be corrected through timing editor 28 by changing the scheduling of behavioral statement 2 to an earlier clock cycle, such as cycle $T_1$.

Once the RAW dependency rule violation 71 has been examined and/or corrected, violation 71 is typically deleted by selecting editing control 75 so that only unexamined violations remain for viewing in display view 70. If further analysis is desired, violation 71 can be left in display view 70 until analysis is complete. The designer then selects another violation for examination, e.g., violation 72, and branches to step 34 to loop through steps 34–37 and dispose of violation 72 in a similar fashion.

Violation 72 indicates that a resource conflict architectural rule violation was detected with respect to statements 3 and 4 of Table 1. More particularly, statements 3 and 4 were scheduled to be performed by the same RTL component on the same clock cycle. In the scheduling described in FIG. 6, the multiplication operations X1=X*X and Y1=Y*Y of statements 3 and 4, respectively, are both scheduled during clock cycles $T_2$ and $T_3$ for execution by pipelined multiplier 501 shown in FIG. 5. Accordingly, violation 72 indicates that the resource conflict rule was violated with respect to the multiplication operations of statements 3 and 4 of Table 1.

Figure 9:
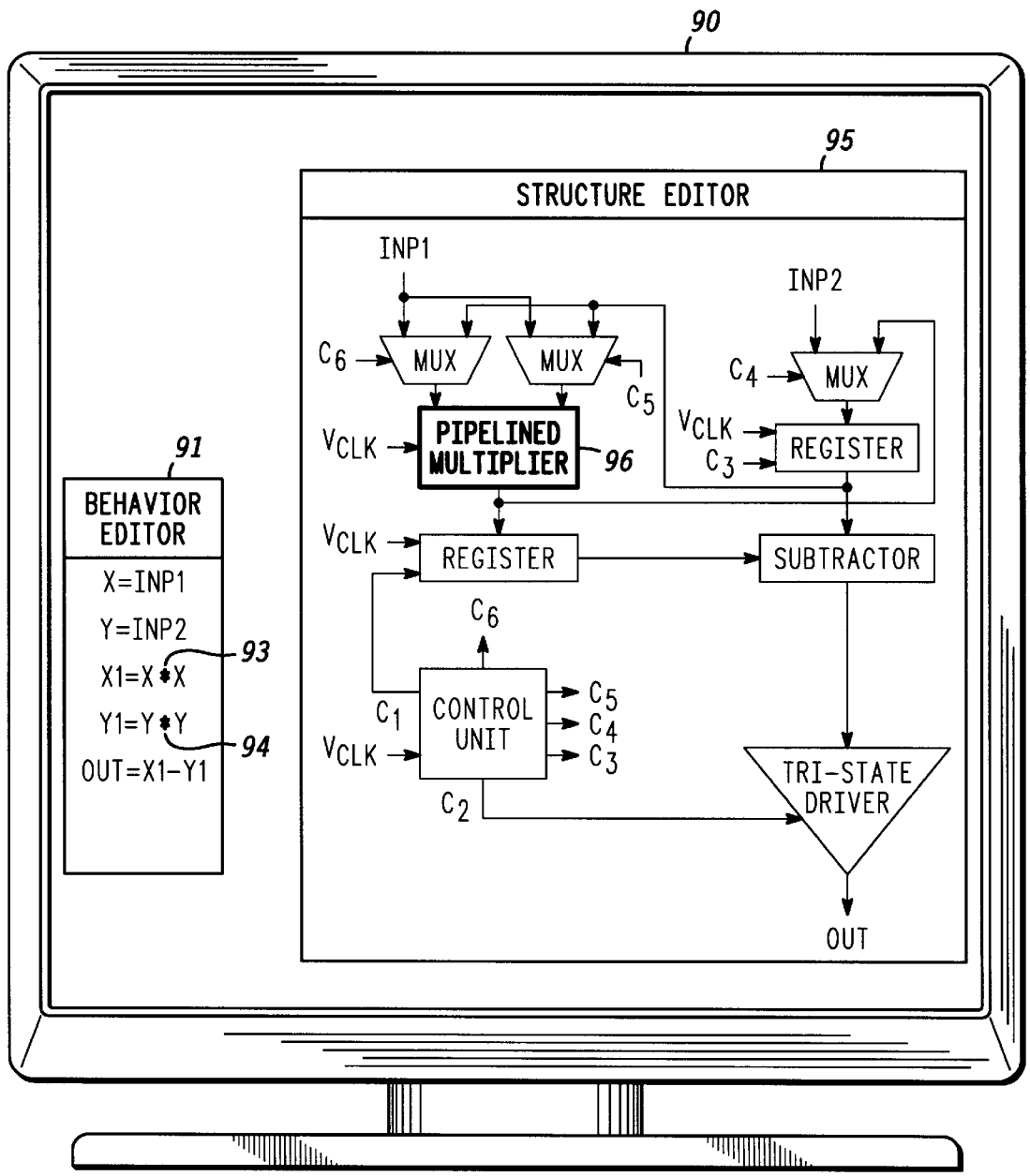
FIG. 9 is a display view of an algorithmic description and an RTL implementation highlighting objects that violate an architectural rule.

Referring to FIG. 9, a display view 90 is shown for displaying objects associated with resource conflict rule violation 72 through result display interface 25. Display view 90 is shown as a split view including a panel 91 viewed in behavior editor 26, and a panel 92 viewed in structural editor 27. While shown as a split view, panels 91 and 92 can alternatively be displayed by other essentially concurrent viewing methods such as displaying panels 91 and 92 in multiple windows.

Panel 91 includes display elements 93 and 94 representing behavioral statements 3 and 4 in which the respective multiply operations are highlighted to indicate an association with violation 72. Similarly, panel 92 represents RTL implementation 500, with display element 96 (a display of pipelined multiplier 501) highlighted to indicate that pipelined multiplier 501 is an object associated with violation 72.

Because display elements 93 and 94 are viewed in behavioral editor 26, the designer can modify behavioral statements 3 and 4 immediately without leaving behavioral editor 26 by accessing and editing data in design database 24. Similarly, display element 96 is viewed in structural editor 27, so that a desired modification to RTL implementation 500 is made by accessing and editing data in design database 24 without leaving structural editor 27.

When the review of violation 72 is complete, violation 72 is deleted from the result display interface 25 and the designer can again loop through steps 34 to 37 to examine the remaining violation 73. Violation 73 indicates that a value lifetime architectural rule violation was detected with respect to statements 1 (X=INP1) and 3 (X1=X*X) of Table 1. The value lifetime architectural rule is used for determining whether data values will be available in a RTL implementation when needed. The rule tests whether the data value has been scheduled for storage in a register or other storage component. Using timing editor 28 to examine the waveforms mapped to statements 1 and 3 of FIG. 6, it is seen that statement 3 (X1=X*X) is scheduled during clock cycles $T_2$ and $T_3$ and statement 1 (X=INP1) is scheduled at $T_1$. Because the intermediate data value X produced in statement 1 was not scheduled to be stored, data value X is not available when needed for executing statement 3. Violation 73 displays notice to the designer that corrective action may be indicated.

Figure 10:
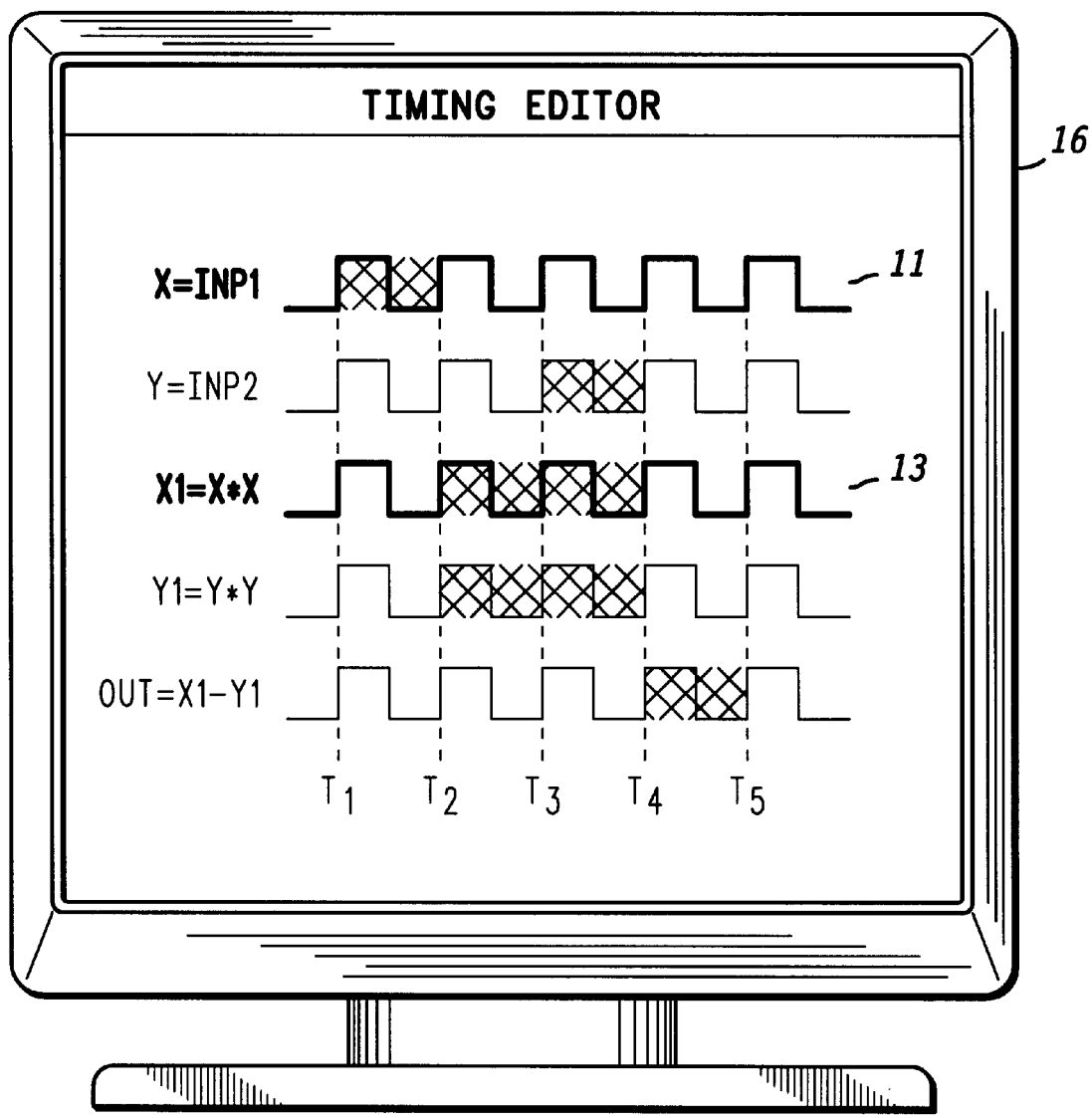
FIG. 10 is a display view of a timing chart highlighting a scheduling violation.

Referring to FIG. 10, a display view 16 is shown displaying objects associated with value lifetime architectural rule violation 73. Display view 16 is shown as viewed in timing editor 28. Display elements 11 and 13 correspond to statements 1 and 3 of Table 1 and to waveforms 61 and 63 of FIG. 6, respectively. Display elements 11 and 13 are highlighted to indicate the association with violation 73. Because display view 16 is displayed in timing editor 28, the designer can interactively modify the scheduling to make desired scheduling modifications without leaving timing editor 28. For example, the scheduling of statement 3 (X1=X*X) can be changed from clock cycles $T_2$ and $T_3$ to clock cycles $T_1$ and $T_2$.

Once violation 73 has been examined and desired modifications have been made to the mapping data of the design, violation 73 is typically deleted from display view 70. Once all the violations have been disposed of, either a new rule suite is selected or the static error identification method terminates.

Even though errors relating to static characteristics of a design can be identified and corrected using the above-described method, other aspects of the system's operation can arise when the RTL implementation is simulated. For example, static design errors may be corrected by comparing mapping data to a set of architectural rules as described above. However, system performance may not meet a design constraint because a signal is conducted on an excessively long interconnect path when a particular combination of input values is provided during testing or simulation.

In verifying or analyzing an integrated circuit design, the designer typically simulates the RTL implementation under a variety of input and timing conditions in order to be sure that the RTL implementation performs in accordance with the algorithmic description. Aspects of the design not described algorithmically, such as timing and power consumption constraints, are analyzed during the simulation phase. The designer typically provides the algorithmic description and often prefers the algorithmic statements as being the most understandable representation of the circuit. It is therefore advantageous that the RTL implementation be dynamically analyzable in terms of the algorithmic description.

Figure 11:
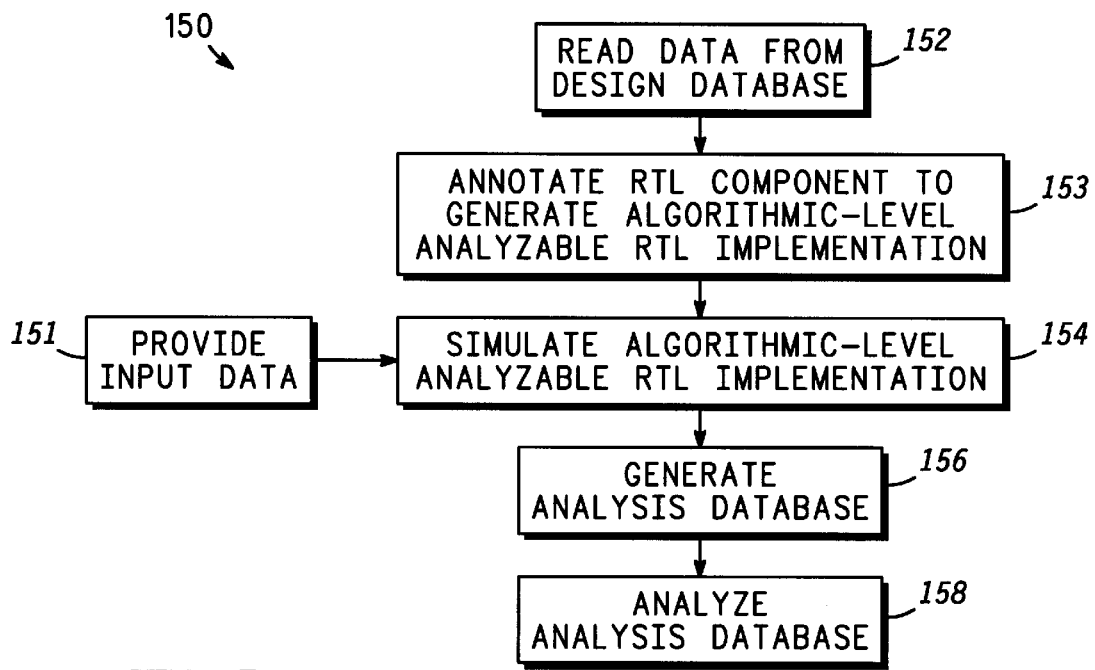
FIG. 11 is a flow chart of a method for characterizing the dynamic operation of an architectural system.

FIG. 11 is a flow chart of an algorithmic-level dynamic analysis method 150 for a RTL implementation, comprising steps 151–158. Algorithmic-level dynamic analysis method 150 provides the designer with a procedure for analyzing the dynamic operation of an RTL implementation that is generated from an algorithmic description. Method 150 allows the design to be characterized at an algorithmic level, with which the designer is more familiar, while the simulation program produces data that represents the dynamic operation of the design at the RTL level. At step 151, data values provided by the designer for input variables of the algorithmic description are received. At step 152, design data from design database 24 is received.

At step 153, an algorithmic-level analyzable description of the design is generated from the design data by annotating one or more RTL components described in greater detail below. The algorithmic-level analyzable description is generated to assist the designer in analyzing the dynamic behavior of the design. Designers often are most familiar with the representation of the design at the algorithmic level because the algorithmic description is generated by the designer. Therefore, the designer can more easily relate operation of the design to behavioral statements than to RTL components, which are typically generated automatically.

Most if not all simulators produce data at the RTL architectural level. When a standard simulator simulates the algorithmic-level analyzable description, hardware-level data is also produced which is stored in an analysis database (step 156). In addition, behavioral, scheduling and mapping data are stored in the analysis database in order to provide the designer with linked information for evaluating and characterizing system operation at all architectural levels. Therefore, an algorithmic-level analyzable description is one that is simulated at the hardware architectural level and produces data that is analyzable at the algorithmic-level.

At step 154, the algorithmic-level analyzable description is simulated over a range of simulation cycles using a standard RTL simulator along with input data provided at step 151. States of the algorithmic-level analyzable description which are produced by the simulation are stored in an analysis database (step 156) which can either be stored in memory for immediate characterization or in a file for analysis at a later time. At step 158, the analysis database is read into a graphics user interface tool so the designer can characterize the design at the algorithmic-level.

Figure 12:
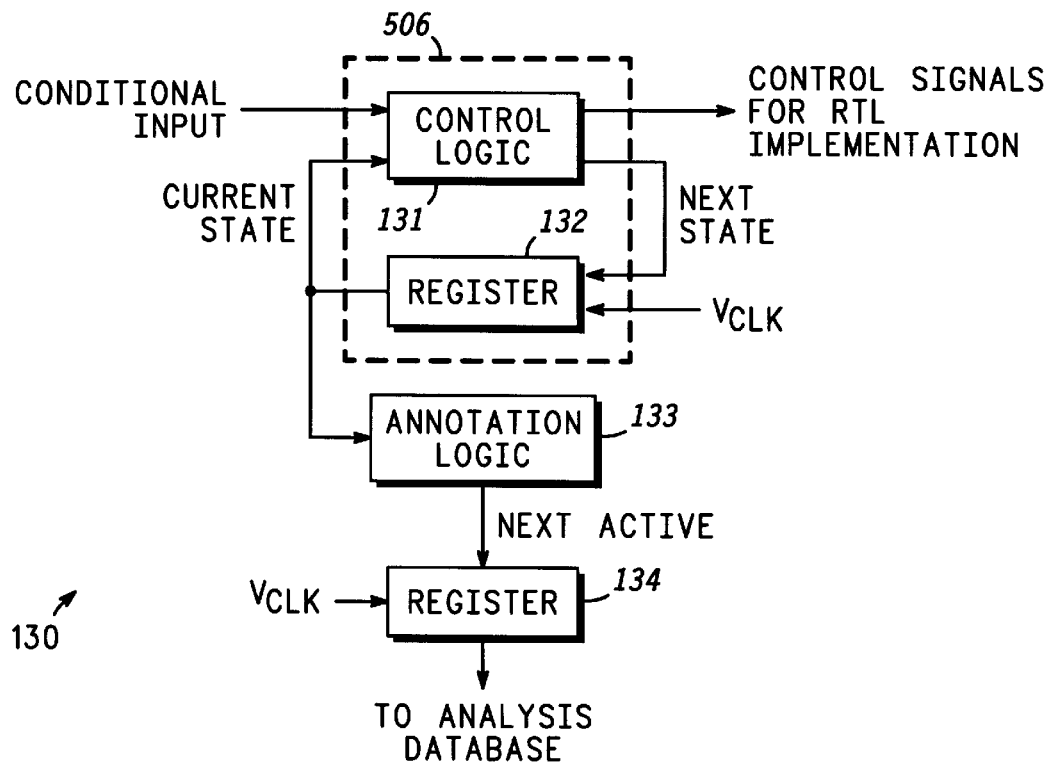
FIG. 12 is an annotated control unit.

FIG. 12 shows an annotated control unit 130 generated at step 112, including a control logic circuit 131, a register 132, an annotation logic circuit 133, and a register 134. Control logic circuit 131 and register 132 comprise control unit 506 shown in FIG. 5, which was automatically generated at step 112 for executing behavioral statements 1–5 of Table 1. Control logic circuit 131 is typically implemented using hard-wired logic, but alternative configurations can be used, such as read-only memory or programmable logic arrays, which provide comparable operation. Accordingly, control unit 506 typically functions as a finite state machine in which register 132 records state changes of control logic circuit 131 for each cycle of $V_{CLK}$. Control unit 506 is shown as having a conditional input. The conditional input receives the values of conditional statements where such statements are incorporated in the algorithmic description. However, Table 1 has no conditional statements, so the conditional input is not used.

Annotation is the process of coupling to one or more RTL components an artificial circuit or model which is embedded in the RTL implementation during simulation. The artificial circuit functions as a daemon circuit, i.e., a circuit that operates in the background during simulation (step 154) without affecting operation of the original RTL implementation. Hence, to annotate control unit 506 is to couple annotation logic circuit 133 and register 134 to control unit 506. Annotation logic circuit 133 and register 134 comprise an annotation unit generated at step 152. The annotation unit stores active algorithmic statements, active RTL components and other simulation results in the analysis database during each clock cycle, including values of behavioral variables and structural signals (signals at nodes of the RTL implementation) in the analysis database. Annotation logic circuit 133 and register 134 do not otherwise affect operation of the RTL implementation.

Table 2 is a simplified example showing the contents of annotation logic 133 as implemented for storing the behavioral statements 1–5 of Table 1 which are active at each clock cycle.

TABLE 2

| CURRENT CYCLE | ACTIVE STATEMENTS (1–5) |
|---|---|
| $T_1$ | 1 1 1 0 0 |
| $T_2$ | 0 0 1 1 0 |
| $T_3$ | 0 0 0 1 0 |
| $T_4$ | 0 0 0 0 1 |
| $T_5$ | 0 0 0 0 0 |

In Table 2, a logic zero indicates a statement that is inactive during a clock cycle and a logic one indicates a statement that is active during the cycle.

Annotation logic circuit 133 essentially operates as a lookup table that correlates directly with the shaded clock cycles shown in FIG. 4. The CURRENT CYCLE column shows the current clock cycle, which corresponds to the CURRENT STATE at the input of control unit 506, i.e., the state of the system during the current clock cycle. Column ACTIVE STATEMENTS is a binary indication of which of the statements 1–5 are active during the current cycle. It is important to note that Table 2 is a simplified example of annotation logic circuit 133 that shows active behavioral statements. Annotation logic circuit 133 is typically extended to include additional columns which are mapped to RTL components to indicate which RTL components are active during a clock cycle. In addition, entries can be provided for storing data values of variables and operations in behavioral statements and values of named and unnamed signals in the RTL implementation. Finally, it should be noted that when conditional statements are used whose values are provided at the conditional input of control unit 506, a comparable table is included in annotation logic circuit 133 for each value of the conditional statements. Conditional statements typically result in a substantial increase in the complexity of annotation logic circuit 133.

During simulation step 154, annotation logic circuit 133 monitors the value of CURRENT STATE (and conditional input data where appropriate) at the input of annotation logic circuit 133. Based on the values of INPUT and CURRENT STATE, annotation logic circuit 133 computes an output value which is indicative of which algorithmic statements and RTL components are active. The output value is clocked into register 134 by system clock $V_{CLK}$ at the end of each cycle. The data in register 134 is then stored in the analysis database along with the current simulation cycle.

Figure 13:
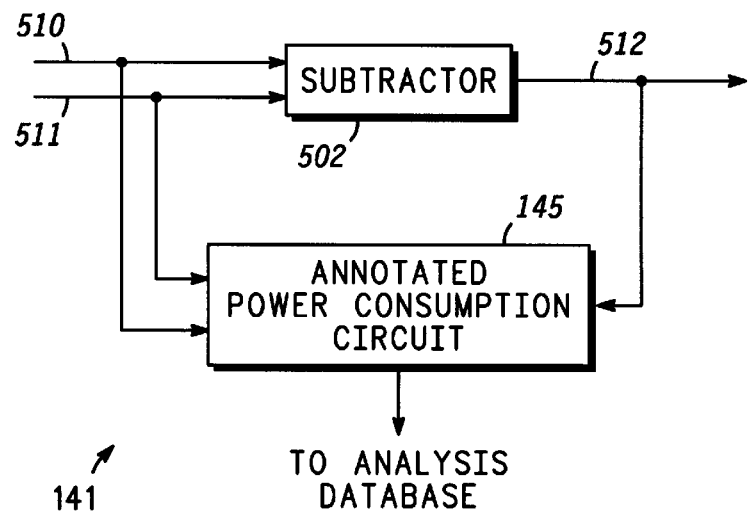
FIG. 13 is an annotated RTL component.

FIG. 13 shows an annotated subtractor 141 comprising subtractor 502 of FIG. 5 and an annotation model or circuit 145 for recording power consumption of subtractor 502 during simulation step 124. Annotated subtractor 141 is representative of any RTL component for which it is desired to compute power consumption. Other component types are configured with similar annotation circuits. Subtractor 502 is chosen to provide a specific example for illustrating how dynamic power consumption is calculated using an annotated power consumption model. Subtractor 502 has inputs 510 and 511 and output 512, which are coupled to inputs of annotation model 145 for monitoring signal values or transitions at the ports of subtractor 502. An output records computed power consumption data in the analysis database along with the simulation cycle. Annotation model 145 can be created as a mathematical model based on the configuration of subtractor 502, or can be implemented with hardware components that perform the equivalent computations.

By way of example, where subtractor 502 is fabricated as a CMOS component the majority of the power is consumed during logic transitions. Therefore, an accurate calculation of power consumption depends on characterizing subtractor 502 dynamically when operating in a system. Accordingly, annotation model 145 can comprise an equation which is a function of power supply voltage and of logic transitions at the ports of subtractor 502.

Figure 14:
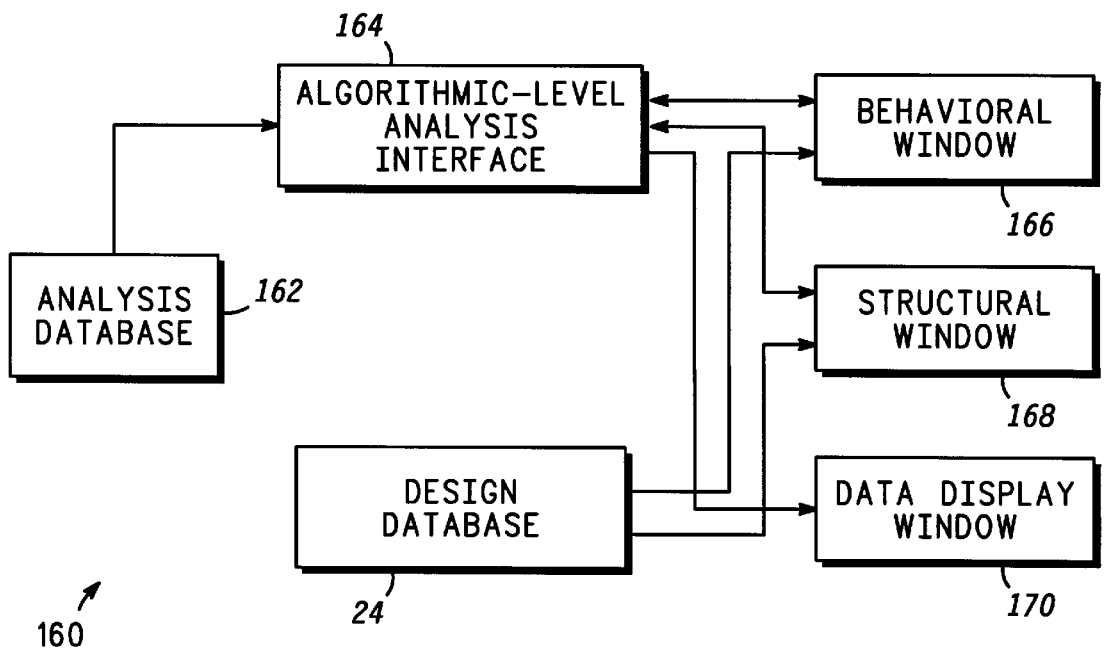
FIG. 14 is a block diagram of a system for characterizing the dynamic operation of the architectural system.

FIG. 14 is a block diagram of a dynamic architectural characterization system 160 including design database 24, a behavioral window 166, a structural window 168, an analysis database 162, an algorithmic-level analysis interface 164, and a data display window 170. Analysis database 162 is generated at steps 154 and 156 of algorithmic-level dynamic analysis method 150. During step 158, data from analysis database 162 is transferred through algorithmic-level analysis interface 164 to behavioral window 166, structural window 168 and data display window 170 for interactive analysis.

Algorithmic-level analysis interface 164 includes one or more executable programs that manage data flow between analysis database 162 and windows 166–170. The management of data flow includes performing various computations on data in analysis database 162 to produce display data in a usable form for the designer. For example, algorithmic-level analysis interface 164 includes an executable profiling program that counts simulation cycles during which particular behavioral statements and RTL components are active in order to create statement and structural profiles of the design. The profiling program stores the results in analysis database 162 or displays the results in data display window 170.

Figure 15:
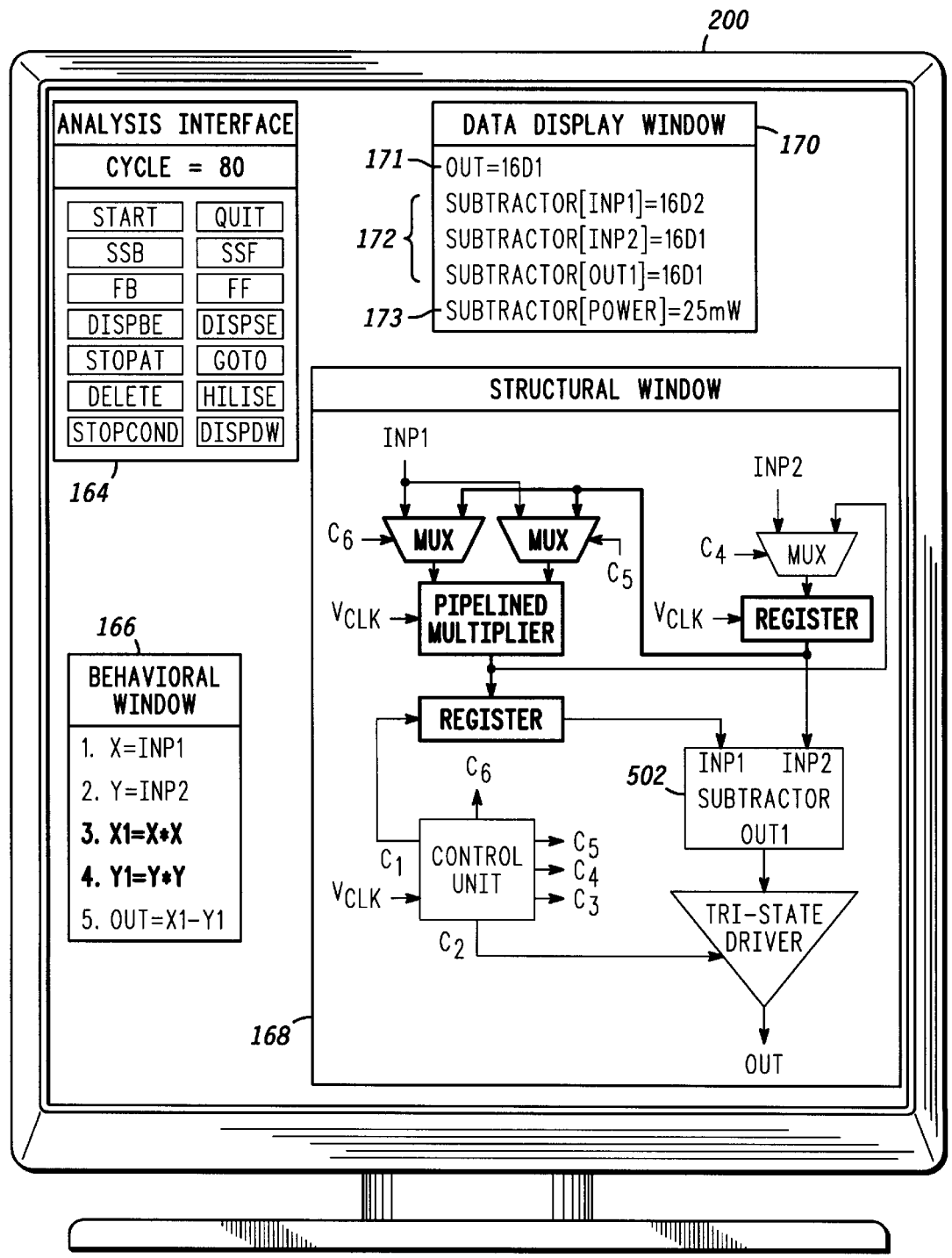
FIG. 15 is a display view showing the state of the system at a selected simulation cycle.

FIG. 15 is a display view 200 including algorithmic-level analysis interface 164, data display window 170, behavioral window 166, and structural window 168. Display view 200 represents a typical display environment that provides the designer with a tool to view particular selected aspects of the system at the most appropriate architectural levels. Analysis interface 164 operates as a control mechanism for selecting particular simulation cycles for displaying the corresponding states of the design.

Initially, the designer selects a simulation cycle by entering an integer representing the simulation cycle and activating GOTO in analysis interface 164. For example, cycle "80" is shown in analysis interface 164 as the selected simulation cycle. The algorithmic description is shown in behavioral window 166 with the active behavioral statements highlighted. For example, statements 3 and 4 are active during simulation cycle "80" and therefore are highlighted as shown in behavioral window 166. When HILISE is activated in analysis interface 164, RTL components which are active during simulation cycle "80" are highlighted in structural window 168 as shown.

To display the current value of behavioral elements such as variables or operators, the designer selects the behavioral element and activates DISPBE in analysis interface 164 to display the current values of the behavioral element or operator in data display window 170. For example, assume the designer selects the variable OUT in statement 5 of behavioral window 166. Analysis interface 164 retrieves the value of the variable OUT at simulation cycle "80" from analysis database 162 and displays the result as entry 171 in data display window 170 as shown. Alternatively, where the designer selects an operator rather than a variable, such as the multiply symbol (*) of statement 3, the values of the operands and result of the operation are all displayed in data display window 170.

To display the current values of structural elements such as signals or RTL components, the designer selects a structural element in structural window 168 and activates DISPSE in analysis interface 164. The selected values are displayed in data display window 170. For example, assume the designer selects subtractor 502 in structural window 168. Analysis interface 164 retrieves the values of the signals at the ports of subtractor 502 at simulation time 80 from analysis database 162 and displays the result as entries 172 in data display window 170 as shown. Alternatively, where a conductor is selected instead of an RTL component, the value of the signal on the conductor is displayed.

Power consumption of an annotated RTL component during a particular cycle is displayed in data display window 170 by selecting the RTL component in structural window 168 and activating DISPPW in analysis interface 164. The power consumption of the selected component is displayed in data display window 170. For example, assume the designer selects subtractor 502 in structural window 168 and activates DISPPW. Analysis interface 164 retrieves the value of power consumption computed by the annotation model of subtractor 502 during simulation time "80" from analysis database 162 and displays the result as entry 173 as shown. Power is displayed independently of the display of data values.

Because the simulation results for each simulation cycle are stored in analysis database 162, the designer can select a new simulation cycle for display which is independent of the currently displayed simulation cycle. For example, the next or previous cycles are displayed by activating SSF or SSB, respectively in analysis interface 164. The designer can skip forward or backward among the simulation cycles by activating GOTO and entering the desired simulation cycle. Whenever the simulation cycle is changed, behavioral window 166, data display window 170 and structural window 168 are automatically updated to display current data values or highlight the currently active statements and RTL components.

Controls SSF, SSB, FF, FB, STOPAT and STOPCOND in analysis interface 164 control the simulation cycles that are displayed. By using such controls, the designer is able to skip among simulation cycles in the range of simulation cycles to display states of the algorithmic-level analyzable description in different orders. SSF and SSB single-step the displayed simulation cycle forward and backward one cycle, respectively. SSF and SSB are typically recurrent controls.

FF and FB are recurrent controls that cause the displayed simulation cycle to skip forward or backward to an arbitrary simulation cycle, respectively. STOPAT and STOPCOND define stop points for the FF and FB controls. In particular, the designer activates STOPAT to skip to the next (or previous) simulation cycle when a selected statement or RTL component is active. For example, the designer selects statement 5 and activates STOPAT to set stop points when statement 5 is active. To display the next time statement 5 is active, FF is activated. To display the previous time statement 5 was active, FB is activated.

STOPCOND functions similarly to STOPAT except that STOPCOND defines the stop points in terms of a conditional expression. The designer provides a conditional expression and a defines a value for the conditional expression. Stop points are set to those simulation cycles where the computed value of the conditional expression is equal to the value defined by the designer. For example, if the designer wishes to display the next simulation cycle when the variable OUT in statement 5 is equal to one, the designer activates STOPCOND and enters OUT=1 in a pop-up window or the like. Stop points are set at those simulation cycles when the conditional expression is true, i.e., whenever OUT=1. To display the next time OUT=1, FF is activated, and to display the previous time OUT=1, FB is activated.

Recall that an RTL implementation typically comprises a schematic diagram of an integrated circuit. Data generated from such a schematic diagram is used to produce photomasks for fabricating physical structures of the RTL implementation on a semiconductor substrate to produce an integrated circuit. The present invention therefore comprises steps in the design phase of a manufacturing process for fabricating an integrated circuit which includes the RTL implementation.

Figure 16:
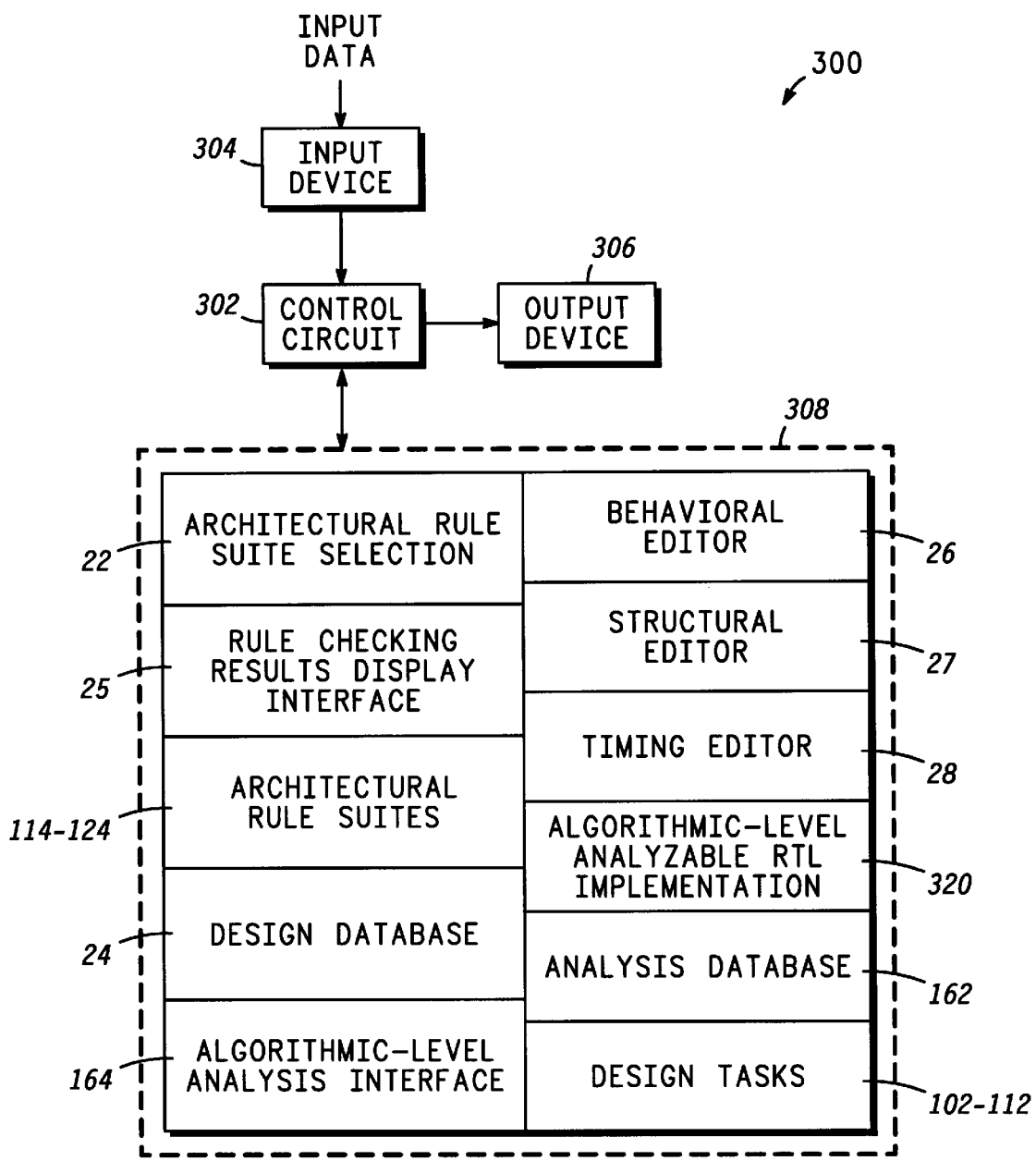
FIG. 16 is a block diagram of a computer used to analyze the architectural system.

FIG. 16 shows a block diagram of a computer 300 used to characterize an architectural design of an integrated circuit using static error identification system 20 and dynamic architectural characterization system 160. Computer 300 includes a control circuit 302, an input device 304, an output device 306 and a memory 308. Input device 304 provides a means for entering input data into computer 300. Where data is entered interactively by a designer, input device 304 typically includes a keyboard. However, input device 304 can also comprise other types of input devices such as a mouse, a disk or tape drive, a modem, a scanning device and the like. Input data is coupled through input device 304 to control circuit 302, which manages the flow and display of data stored in memory 308. Control circuit 302 also executes utility programs stored in memory 308 that determine how the input data is processed.

Output device 306 typically includes a display monitor for interactively displaying data received from control circuit 302 which is representative of the integrated circuit architectural system being designed. Output device 306 can include other types of devices which display or transfer data which is generated or stored in computer 300, such as printers, modems, disk or tape drives and the like.

Control circuit 302 executes software utility programs stored in memory 308 for implementing design tasks 102–112, utility programs for architectural rule checking included in architectural rule suite selection interface 22, and software programs included in algorithmic-level analysis interface 164. Control circuit 302 typically comprises a microprocessor, but the functions of control circuit 302 can be provided by other types of logic circuits including state machines. Control circuit 302 also executes editing programs stored in memory 308 which provide a graphical or textual interface between computer 300 and the designer. Such editing programs include behavioral editor 26, structural editor 27, and timing editor 28.

Control circuit 302 manages the flow of data internal to computer 300 as well as input data received from input device 304 and display data transferred to output device 306. Control circuit 302 retrieves, modifies and stores data saved in design database 24 of memory 308, under the direction of a utility program or an editor.

Memory 308 includes the above described plurality of memory regions for storing data and software programs used to compare data generated by the design tasks with a set of architectural rules. Memory 308 further includes storage for an algorithmic-level analyzable description 320, design database 24 and analysis database 162. Memory 308 can comprise random-access memory, read-only memory, magnetic storage media such as floppy disks, hard disks and magnetic tape, optical storage media such as compact disks, and similar memory devices or combinations thereof.

By now it should be appreciated that a computer implemented error identification and characterization system has been provided to allow an integrated circuit designer to efficiently characterize an architectural system. A set of architectural design rules are arranged into a plurality of rule suites, each of which includes a utility program that is executed to compare design data to the architectural rules in the suite. Utility programs can be executed immediately after associated design tasks are completed or can be run at a later time after other design tasks have been performed. The utility programs can thereby be executed in different orders to verify the design data by branching from one architectural rule suite to another architectural rule suite to complete the architectural rule checking different orders.

Data can be viewed through one or more editors simultaneously and at multiple architectural levels, such as the behavioral, scheduling and structural architectural levels. Design objects are viewed in context and highlighted for easier identification. Modifications and corrections to the mapping data are interactively made by the designer at any architectural level without leaving the editors.

Dynamic operation of the design is characterized by annotating one or more RTL components to store active statements and components in an analysis database during simulation. Annotation is a process of coupling an artificial or daemon circuit or model to an RTL component. The daemon circuit operates in the background of the RTL implementation without affecting the normal operation during simulation. The daemon circuit for a control unit monitors system states and stores behavioral statements and RTL components that are active during each simulation cycle in the analysis database. Data from the analysis database is accessed through a graphics interface that allows the designer to skip between simulation cycles to display the condition or state of the system at arbitrary time points.

We claim:

1. A computer implemented method of identifying a design error at an architectural level, comprising the steps of:
   generating through a plurality of design tasks a mapping of a register transfer level (RTL) implementation of a system from an algorithmic description of the system, such that the plurality of design tasks generate portions of the mapping;
   providing a plurality of utilities in which each utility of the plurality of utilities compares at least one portion of the mapping to a set of architectural rules; and
   branching among the plurality of utilities to execute the plurality of utilities in different orders.

2. The method of claim 1, further comprising the step of providing a first architectural rule of the set of architectural rules for characterizing an object of the mapping at first and second architectural levels.

3. The method of claim 2, further comprising the steps of:
   determining whether the object conforms to the first architectural rule;
   displaying the system at the first and second architectural levels to produce first and second views of the system, respectively; and
   highlighting the object in the first and second views when the object does not conform to the first architectural rule.

4. The method of claim 3, wherein the step of displaying the system at the first and second architectural levels includes a step of displaying the system through first and second editors, respectively, and the method further comprises a step of modifying the system through the first or the second editor.

5. The method of claim 4, further comprising the steps of:
   providing an architectural ordering rule of the set of architectural rules, where the architectural ordering rule specifies an order of execution of an operation in the algorithmic description; and
   providing a concurrent resource usage rule of the set of architectural rules to detect whether multiple operations of the algorithmic description are scheduled for an RTL component of the RTL implementation during a clock cycle.

6. The method of claim 4, further comprising the step of providing a resource allocation rule of the set of architectural rules for limiting a number of instances of an RTL component of the RTL implementation.

7. The method of claim 4, further comprising the steps of:
   providing a first storage rule of the set of architectural rules for storing a data value computed in a first operation of the algorithmic description that is used in a second operation of the algorithmic description;
   providing a second storage rule of the set of architectural rules for identifying an RTL storage component of the RTL implementation in which to store the data value such that the RTL storage component has an input bitwidth that matches a bitwidth of the data value; and
   providing a third storage rule of the set of architectural rules for storing a data value that is produced by a first RTL component of the RTL implementation until the data value is used by a second RTL component of the RTL implementation.

8. The method of claim 4, further comprising the steps of:
   providing a first data transfer rule of the set of architectural rules for determining whether to transfer a data value from a first RTL component to a second RTL component of the RTL implementation where the data value is produced by the first RTL component and used by the second RTL component;
   providing a second data transfer rule of the set of architectural rules for transferring the data value from the first RTL component to the second RTL component when the second RTL component is available; and
   providing a third data transfer rule of the set of architectural rules for transferring the data value from the first RTL component to the second RTL component when an interconnect path between the first and second RTL components is available.

9. The method of claim 4, further comprising the step of providing an operation mapping rule for implementing an operation of the algorithmic description with an RTL component of the RTL implementation that performs a function required by the operation.

10. The method of claim 4, further comprising the steps of:
    selecting an interconnect path of the RTL implementation; and
    computing a propagation delay of the interconnect path.

11. A computer-implemented method of dynamically characterizing a system at an algorithmic level, comprising the steps of:

generating a register transfer level (RTL) implementation of the system from an algorithmic description of the system;

annotating a first RTL component of the RTL implementation to produce an algorithmic-level analyzable description of the RTL implementation, wherein the step of annotating includes,
(a) coupling a first daemon circuit to a control unit for monitoring operation of the system over the range of simulation cycles,
(b) determining with the first daemon circuit which algorithmic statements of the algorithmic description are active during each simulation cycle of the range of simulation cycles to produce a set of active statements,
(c) determining with the first daemon circuit which RTT, components of the RTT, implementation are active during each simulation cycle of the range of similation cycles to produce a set of active RTI, components, and
(d) storing the set of active statements and the set of active RTL components in the analysis database;

providing data values for input variables of the algorithmic description;

simulating the algorithmic-level analyzable description with the data values over a range of simulation cycles; and storing states of the algorithmic-level analyzahle description over the range of simulation cycles to produce an analysis database.

12. The method of claim 11, further comprising the steps of:
coupling a second daemon circuit to a second RTL component of the RTL implementation for computing power consumption of the second RTL component; and
displaying the power consumption of the second RTL component.

13. The method of claim 11, wherein the step of storing states of the algorithmic-level analyzable description includes a step of storing values of a structural signal in the analysis database over the range of simulation cycles.

14. The method of claim 11, further comprising the step of skipping among simulation cycles of the range of simulation cycles to display states of the algorithmic-level analyzable description in different orders.

15. The method of claim 14, wherein the step of skipping includes the steps of:
selecting a first simulation cycle of the range of simulation cycles;
displaying the algorithmic description; and
highlighting statements of the algorithmic description that are active during the first simulation cycle.

16. The method of claim 15, further comprising the steps of:
displaying the RTL implementation; and
highlighting RTL components of the RTL implementation that are active during the first simulation cycle.

17. The method of claim 16, further comprising the steps of:
selecting a second simulation cycle of the range of simulation cycles; and
highlighting algorithmic statements and RTL components that are active during the second simulation cycle.

18. The method of claim 17, further comprising the steps of:
selecting a variable of the algorithmic description;
selecting an operation of the algorithmic description;
selecting a structural signal of the RTL implementation; and
displaying computed values of the variable, the operation and the structural signal.

19. The method of claim 16, further comprising the steps of:
selecting an algorithmic statement of the algorithmic description;
skipping to a second simulation cycle in which the algorithmic statement is active;
selecting a second RTL component of the RTL implementation; and
skipping to a third simulation cycle in which the second RTL component is active.

20. The method of claim 16, further comprising the steps of:
defining a conditional expression that includes a variable of the algorithmic description;
specifying a value of the conditional expression; and
skipping to a second simulation cycle in which the conditional expression equals a value of the variable.

21. The method of claim 16, further comprising the steps of:
defining a conditional expression that includes a structural signal of the RTL implementation;
specifying a value of the conditional expression; and
skipping to a second simulation cycle where the conditional expression equals a value of the structural signal.

22. The method of claim 11, further comprising the steps of:
counting simulation cycles of the range of simulation cycles during which statements of the algorithmic description are active to produce a statement profile;
counting simulation cycles of the range of simulation cycles during which RTL components of the RTL implementation are active to produce a structural profile;
storing the statement profile and the structural profile in the analysis database; and
displaying the statement and structural profiles.

23. A computer-readable storage medium, comprising:
a first region of memory for storing a plurality of design tasks for generating a mapping of a register transfer level (RTL) implementation of a system from an algorithmic description of the system, such that the plurality of design tasks generate portions of the mapping;
a second region of memory for storing a plurality of utilities associated with a plurality of architectural rule suites such that each utility of the plurality of utilities compares at least one portion of the mapping to a set of architectural rules in one of the plurality of architectural rule suites; and
a third region of memory for storing a user interface program that branches to one of the plurality of utilities from other ones of the plurality of utilities to execute the plurality of utilities in different orders.

24. The computer-readable storage medium of claim 23, further comprising a fourth region of memory for storing a plurality of data editors for viewing the mapping at multiple architectural levels and for modifying objects of the mapping.

25. The computer-readable storage medium of claim 24, wherein the user interface program highlights an object of the mapping that does not conform to one of the set of architectural rules.

26. The computer-readable storage medium of claim 25, further comprising a fifth region of memory for storing the mapping.

27. The computer-readable storage medium of claim 26, comprising at least one of the group consisting of random-access memory, read-only memory, floppy disks, hard disks, magnetic tape, and compact disks.

28. An integrated circuit manufactured with a fabrication process that includes the steps of:

generating through a plurality of design tasks a mapping of a register transfer level (RTL) implementation of a design of the integrated circuit from an algorithmic description of the design of the integrated circuit, such that the plurality of design tasks generate portions of the mapping;

providing a plurality of utilities in which each utility of the plurality of utilities compares at least one portion of the mapping to a set of architectural rules; and branching among the plurality of utilities to execute the plurality of utilities in different orders.

29. The integrated circuit of claim 28, wherein the fabrication process further comprises the step of providing a first architectural rule of the set of architectural rules for characterizing an object of the mapping at first and second architectural levels.

30. The integrated circuit of claim 29, wherein the fabrication process further comprises the steps of:

determining whether the object conforms to the first architectural rule;

displaying the design of the integrated circuit at the first and second architectural levels to produce first and second views of the design, respectively; and highlighting the object in the first and second views when the object does not conform to the first architectural rule.

31. An integrated circuit manufactured with a fabrication process that includes the steps of:

generating a register transfer level (RTL) implementation of a design of the integrated circuit from an algorithmic description of the design;

annotating a first RTL component of the RTL implementation to produce an algorithmic-level analyzable description of the RTL implementation, wherein the annotating step includes, (a) coupling a first daemon circuit to a control unit for monitoring operation of the design over the range of simulation cycles, (b) determining with the first daemon circuit which algorithmic statements of the algorithmic description are active during each simulation cycle of the range of simulation cycles to produce a set of active statements, (c) determining with the first daemon circuit which RTL components of the RTL implementation are active during each simulation cycle of the range of simulation cycles to produce a set of active RTL components, and (d) storing the set of active statements and the set of active RTL components in the analysis database;

providing data values for input variables of the algorithmic description;

simulating the algorithmic-level analyzable description with the data values over a range of simulation cycles; and storing states of the algorithmic-level analyzable description over the range of simulation cycles to produce an analysis database.

* * * * *

UNITED STATES PATENT AND TRADEMARK OFFICE
CERTIFICATE OF CORRECTION

PATENT NO. : 5,907,698
DATED : May 25, 1999
INVENTOR(S) : Kucukcakar, et al.

It is certified that error appears in the above-identified patent and that said Letters Patent is hereby corrected as shown below:

In column 21, claim 11, line 17, delete "RTT," and replace with --RTL--.

In column 21, claim 11, line 17, second occurrence, delete "RTT," and replace with --RTL--.

In column 21, claim 11, line 19, delete "RTI," and replace with --RTL--.

Signed and Sealed this

Seventh Day of December, 1999

*Attest:*

Q. TODD DICKINSON

*Attesting Officer*     *Acting Commissioner of Patents and Trademarks*